(12) United States Patent
Taniguchi

(10) Patent No.: US 7,395,721 B2
(45) Date of Patent: Jul. 8, 2008

(54) FORCE SENSOR, FORCE DETECTION SYSTEM AND FORCE DETECTION PROGRAM

(75) Inventor: Nobumitsu Taniguchi, Arakawa-ku (JP)

(73) Assignee: Appside Co., Ltd., Tokyo (JP)

( * ) Notice: Subject to any disclaimer, the term of this patent is extended or adjusted under 35 U.S.C. 154(b) by 0 days.

(21) Appl. No.: 11/020,415

(22) Filed: Dec. 23, 2004

(65) Prior Publication Data

US 2005/0252303 A1    Nov. 17, 2005

(30) Foreign Application Priority Data

May 14, 2004    (JP) ............................... 2004-145050

(51) Int. Cl.
 *G01B 7/16* (2006.01)
(52) U.S. Cl. ........................................................ 73/780
(58) Field of Classification Search ................ 73/780
 See application file for complete search history.

(56) References Cited

U.S. PATENT DOCUMENTS

| | | | |
|---|---|---|---|
| 4,542,436 A | | 9/1985 | Carusillo ...................... 361/283 |
| 4,933,807 A | * | 6/1990 | Duncan .................... 361/283.2 |
| 5,497,668 A | * | 3/1996 | Okada ..................... 73/862.626 |
| 5,668,318 A | * | 9/1997 | Okada ...................... 73/504.11 |
| 6,029,524 A | * | 2/2000 | Klauder et al. ................. 73/718 |
| 6,378,381 B1 | * | 4/2002 | Okada et al. ........... 73/862.043 |
| 6,473,290 B2 | * | 10/2002 | Mochida ...................... 361/291 |
| 6,530,283 B2 | * | 3/2003 | Okada et al. ................... 73/780 |
| 6,894,507 B2 | * | 5/2005 | Morimoto .................... 324/661 |
| 6,910,385 B2 | * | 6/2005 | Shkel ........................... 73/780 |
| 6,915,693 B2 | * | 7/2005 | Kim et al. ................. 73/504.12 |
| 6,989,677 B2 | * | 1/2006 | Morimoto .................... 324/660 |
| 6,997,054 B2 | * | 2/2006 | Tsugai ...................... 73/504.12 |

FOREIGN PATENT DOCUMENTS

| | | |
|---|---|---|
| EP | 0 773 444 | 5/1996 |
| EP | 1 109 182 | 12/2000 |
| JP | 6-314163 | 11/1994 |

* cited by examiner

*Primary Examiner*—Max Noori
(74) *Attorney, Agent, or Firm*—Mathews, Shepherd, McKay & Bruneau, P.A.

(57) ABSTRACT

A force sensor converts a force into capacitance and makes it possible to generate a plurality of outputs with different output characteristics, force detection system, and a digital force detection program for it. The force sensor 20 has a displacement unit 24 for generating a displacement when a force is applied; a single or a plurality of first sensor units (36, 36A, 36B, 36C, and 36D) for generating a first output $C_1$ from said displacement of the displacement unit; and a second sensor unit 44, which is annexed to the first sensor unit, for generating a second output $C_2$ from the displacement of said displacement unit. The force detection system enhances the output accuracy by means of the first and second outputs of such a force sensor. The force detection program is used in the force detection system for executing the output process.

8 Claims, 23 Drawing Sheets

FIG. 1
(A) (Prior Art)
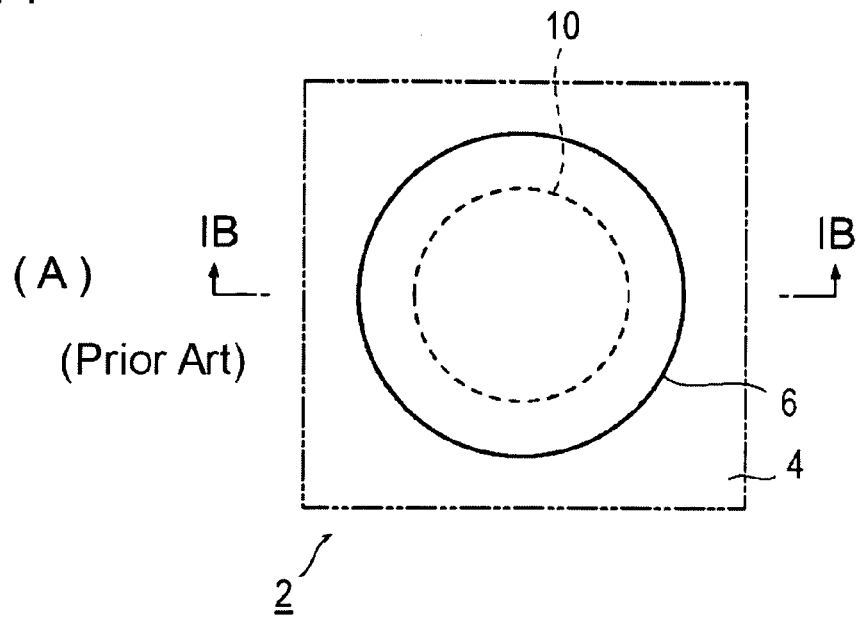
(B) (Prior Art)
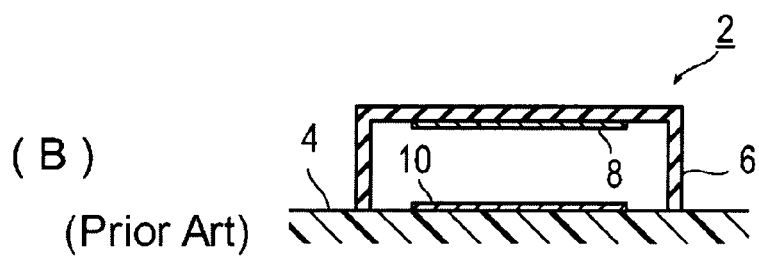
(C) (Prior Art)
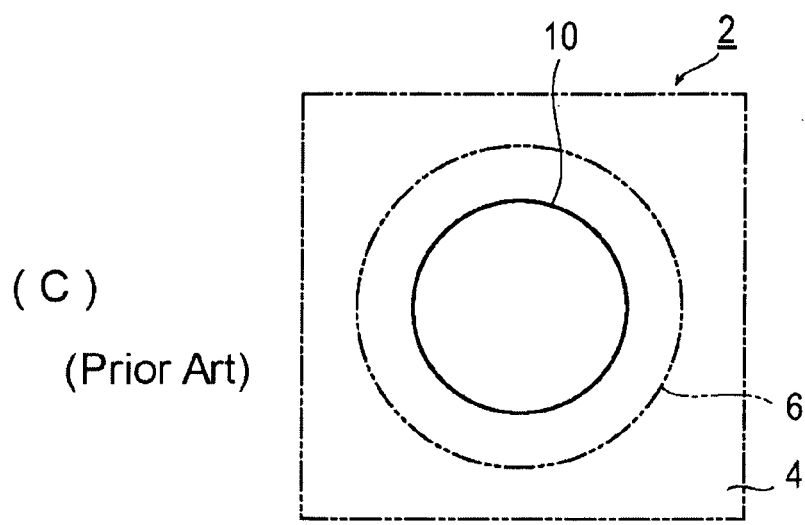

FIG. 3
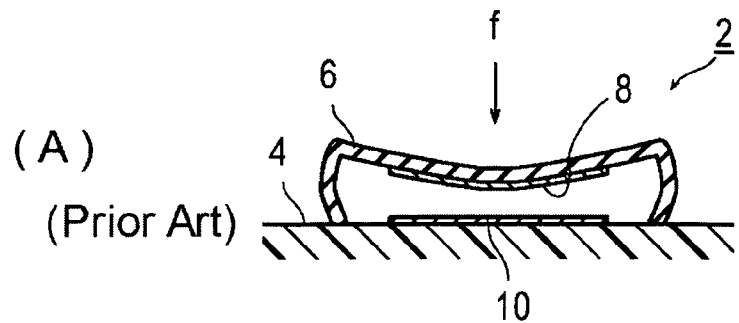
(A) (Prior Art)
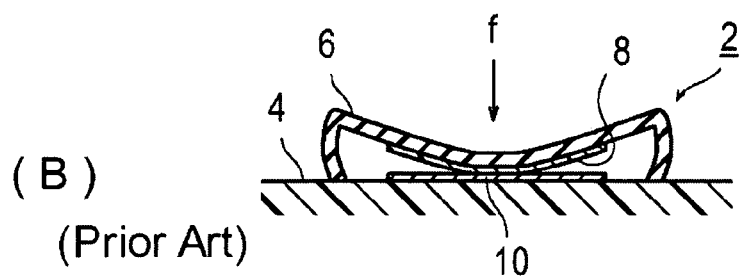
(B) (Prior Art)
FIG. 4
(Prior Art)
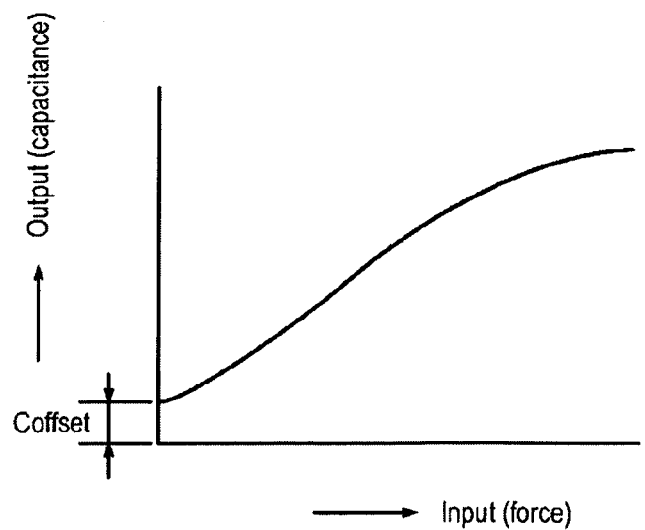

FIG. 9
(A)
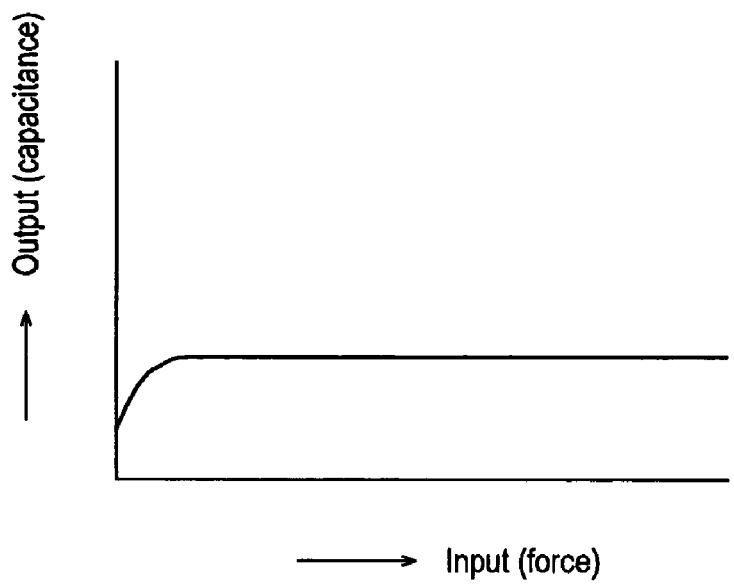
(B)
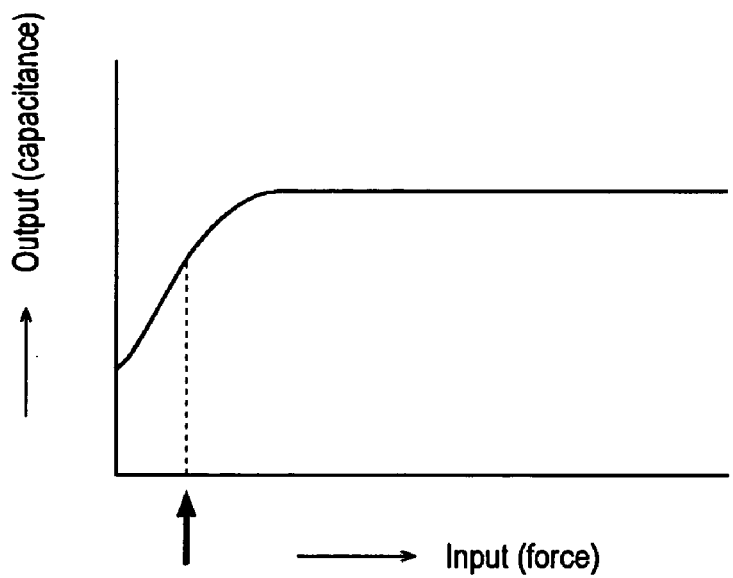

FIG.12
(A) 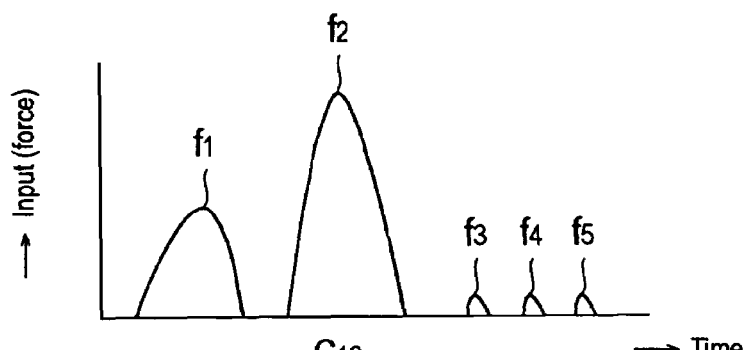
(B) 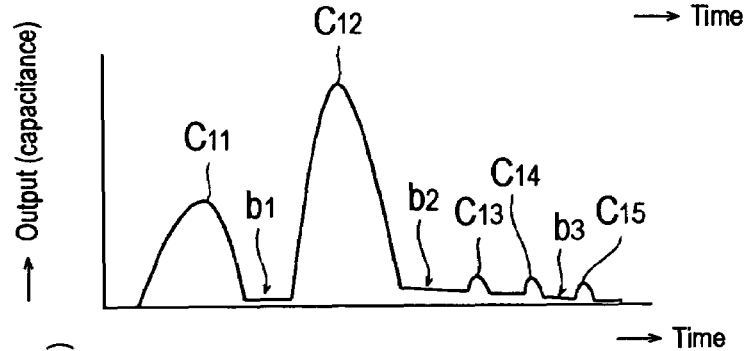
(C) 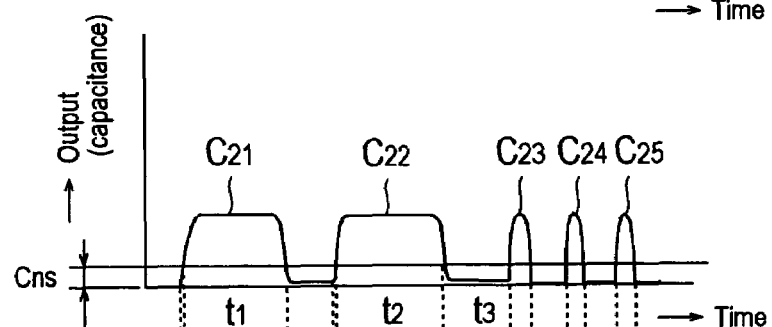
(D) 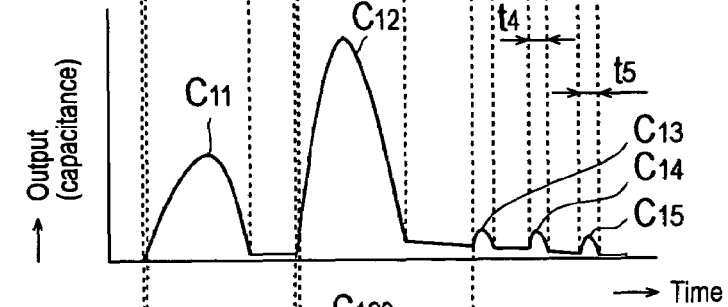
(E) 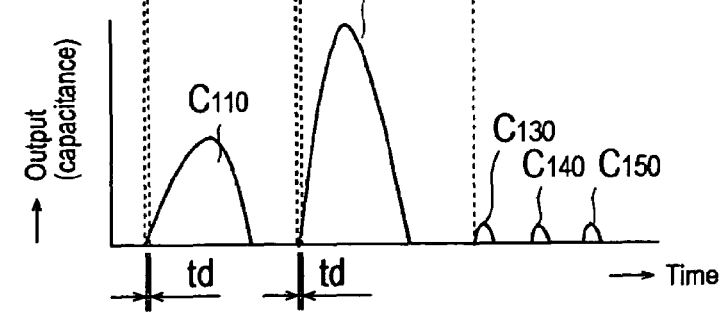

FIG.15
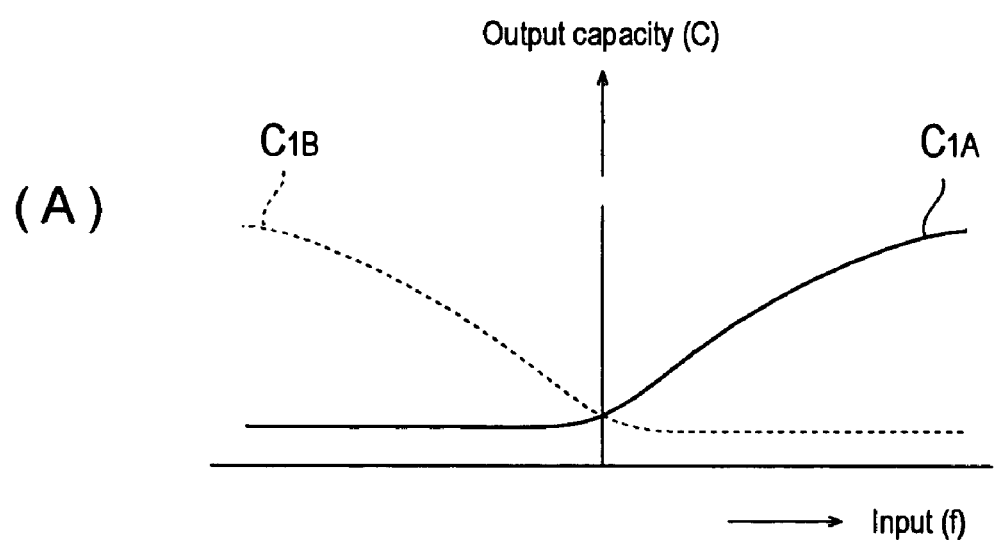
(A)
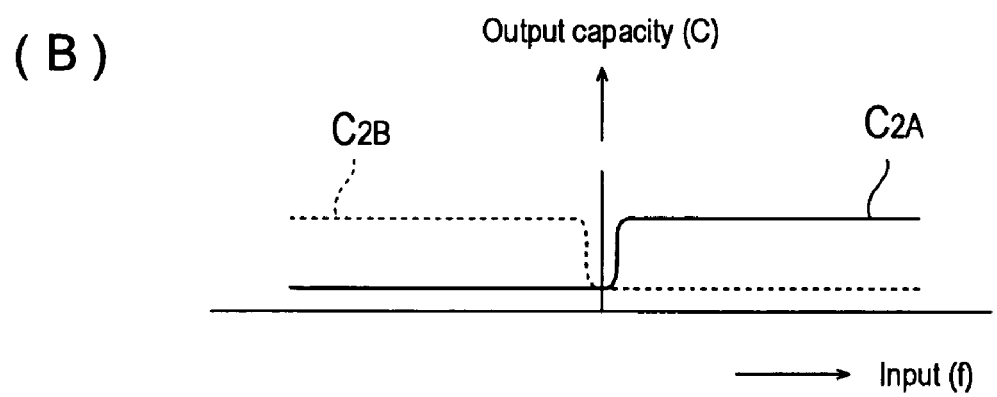
(B)

32A, 32B : First detection electrode
34A, 34B, 42 : Electrode
36A, 36B : First sensor unit
40 : Second detection electrode
44 : Second sensor unit FIG.17
(A)
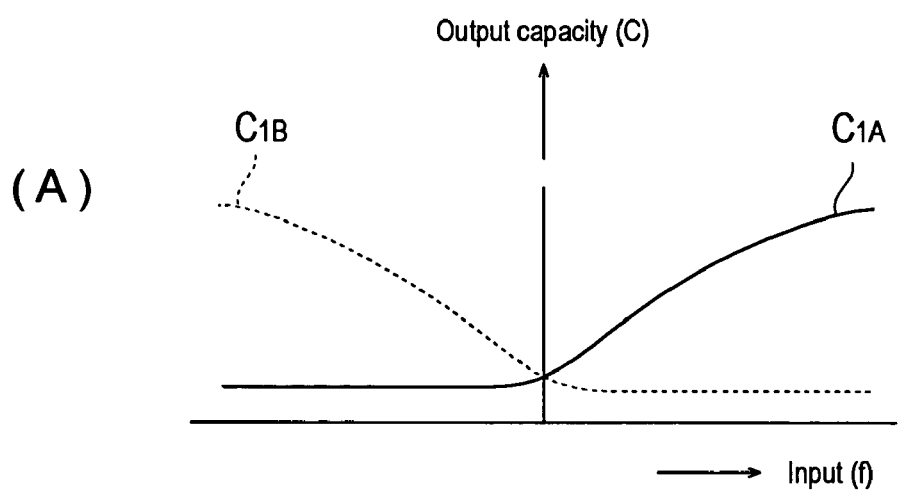
(B)
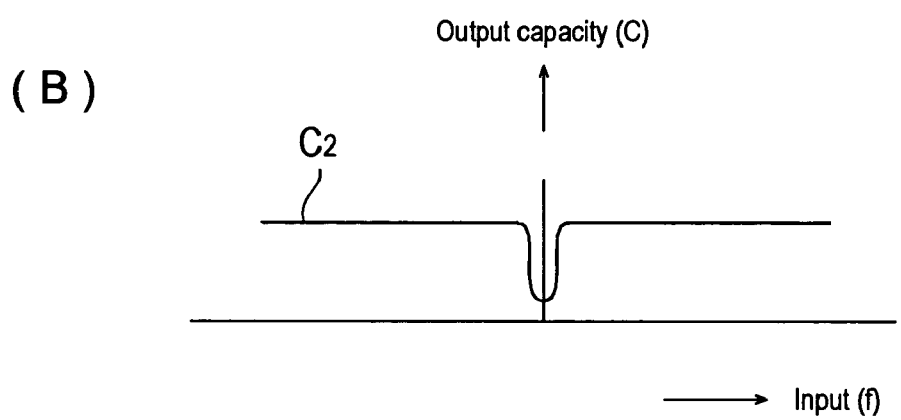

FIG.21
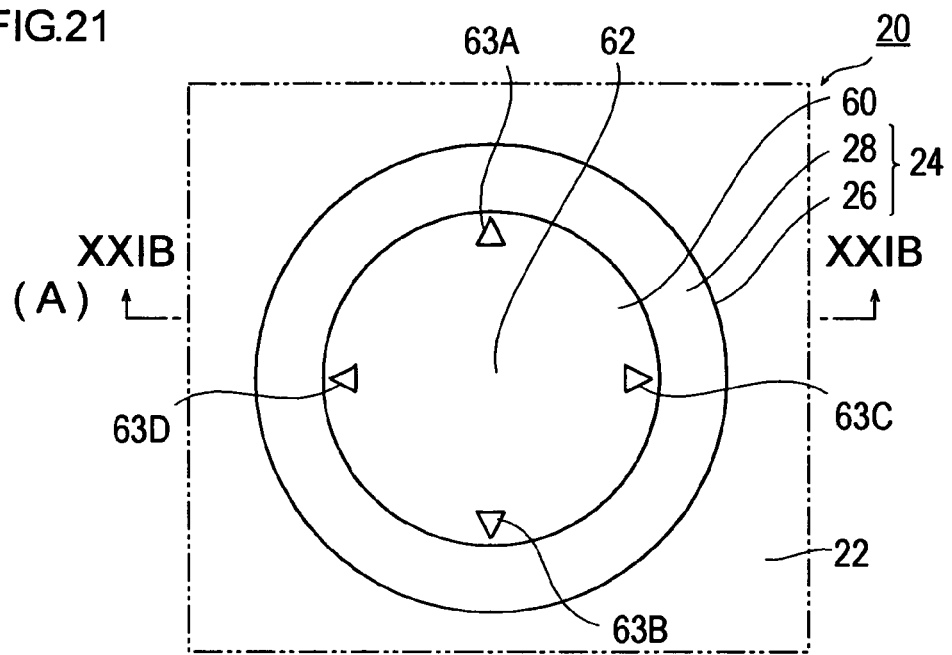
(A)
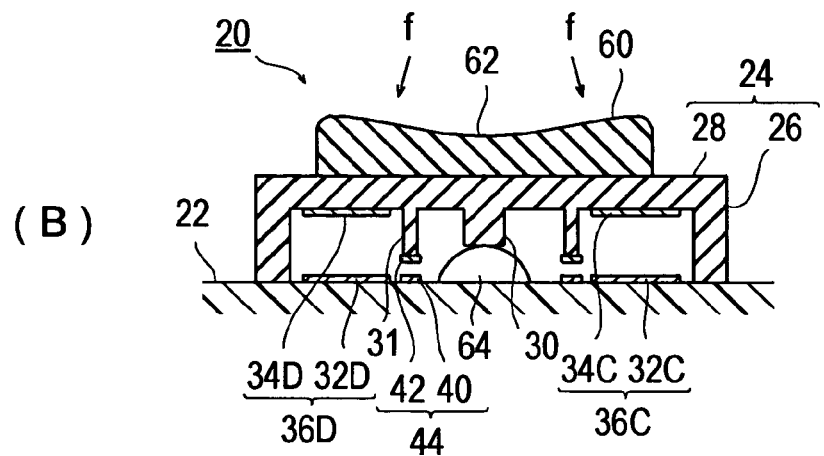
(B)
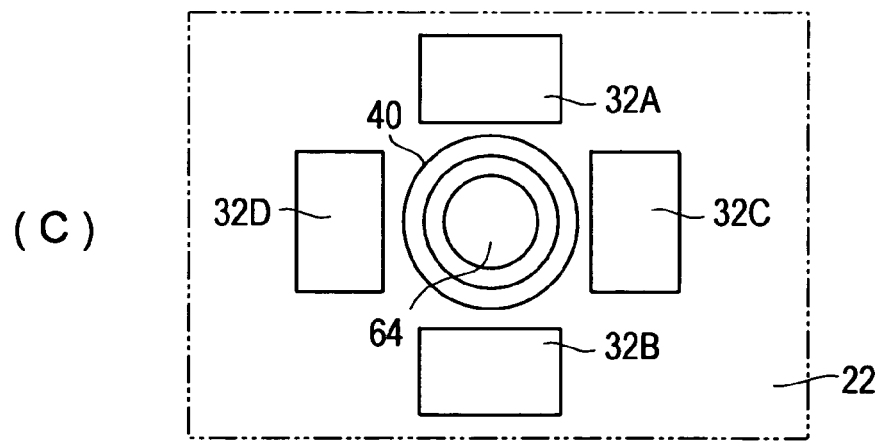
(C)

FIG.22
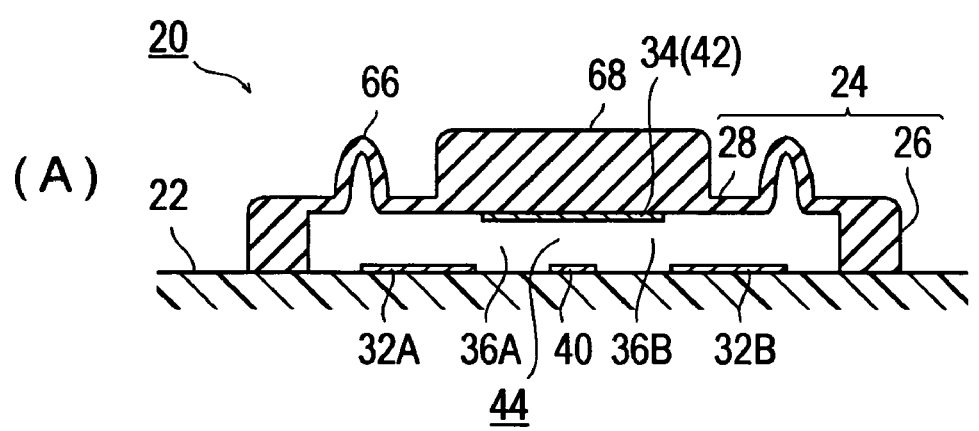
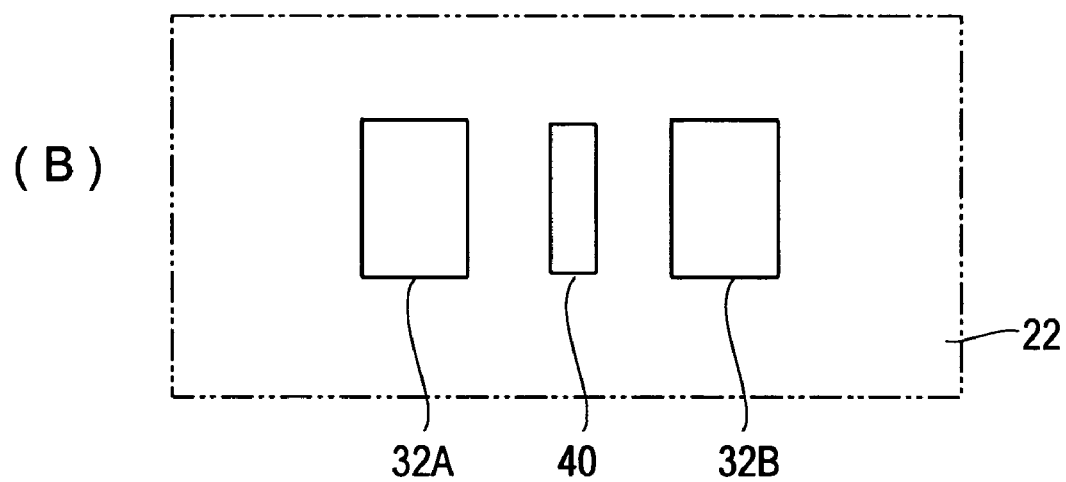

FIG.23
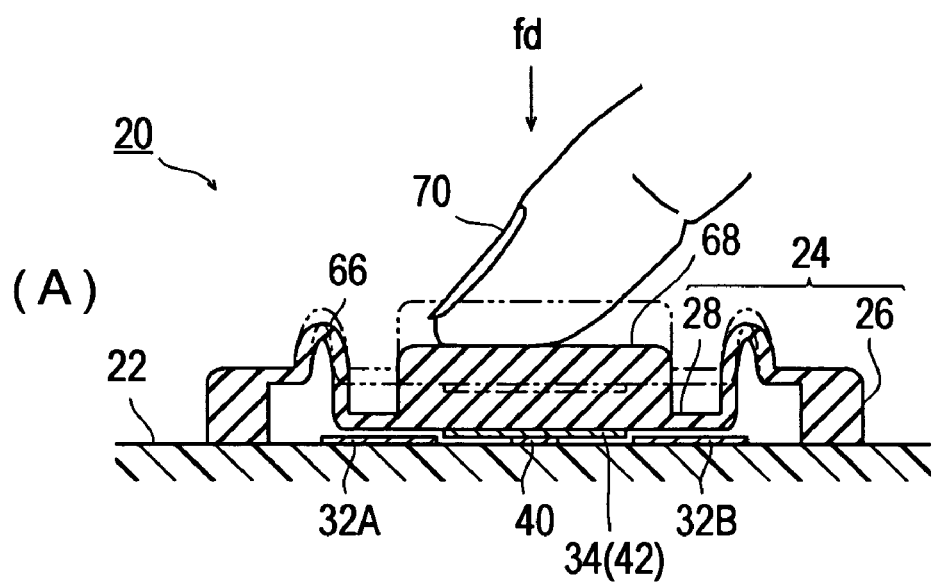
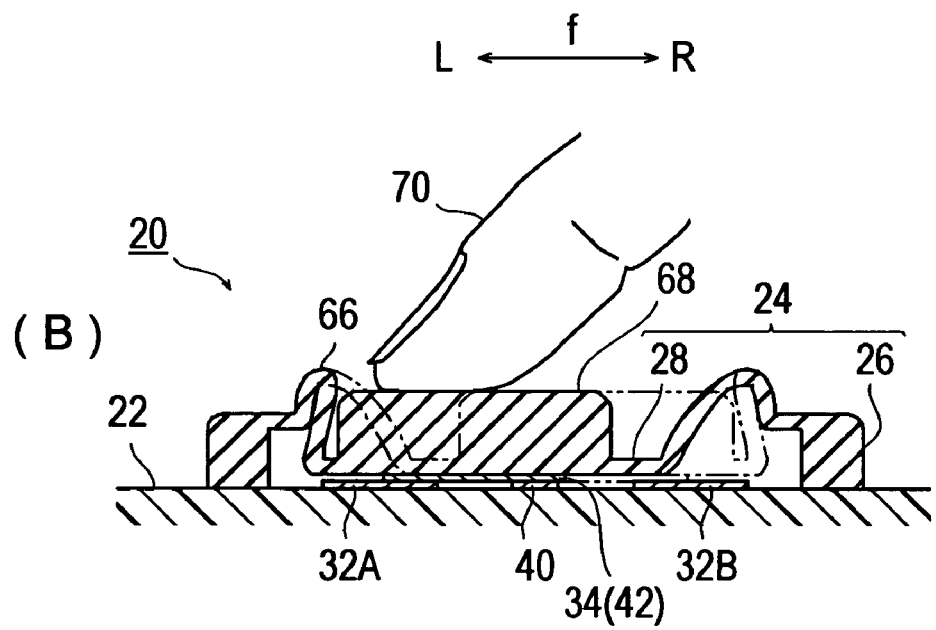

FIG.24
(A)
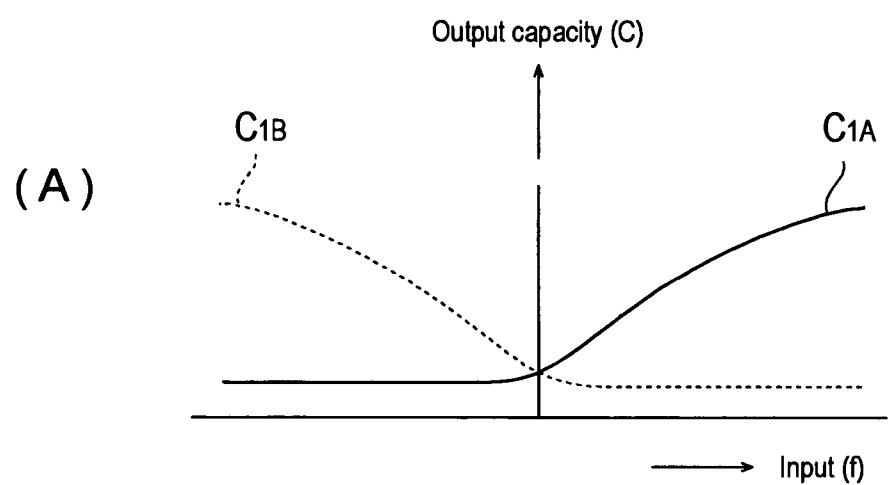
(B)
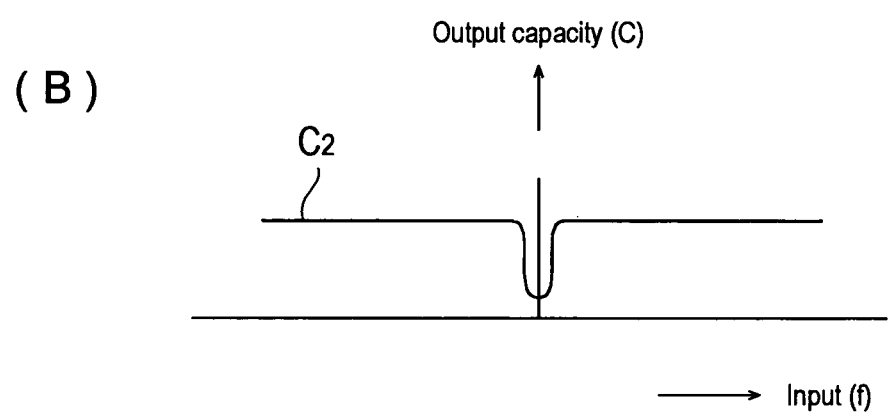

FIG.27
(A) 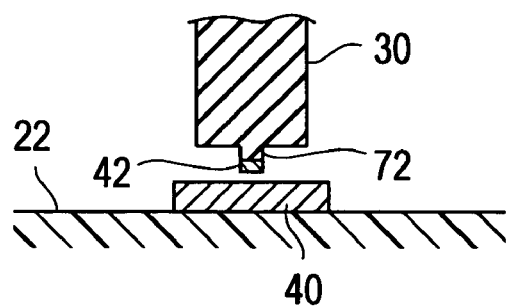
(B) 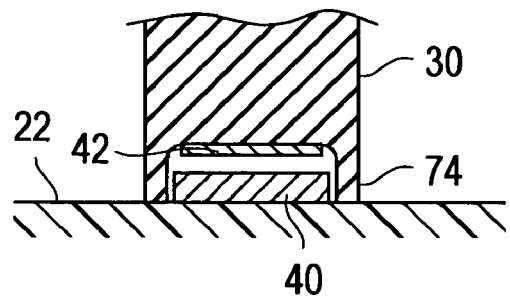
(C) 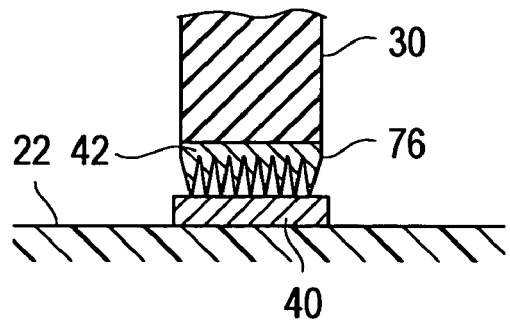

US 7,395,721 B2

FORCE SENSOR, FORCE DETECTION SYSTEM AND FORCE DETECTION PROGRAM

This application is based on Japanese Patent Application No. 2004-145050 filed on May 14, 2004, the contents of which are hereby incorporated by reference.

BACKGROUND OF THE INVENTION

1. Field of the Invention

The invention relates to a force sensor that converts forces to electrical information such as capacitance and the like, in particular, to a force sensor, a force detection system and a force detection program used for conversion of manual inputs and the like into electrical signals.

2. Description of Related Art

The sensor for converting a force to capacitance is typically used for a bathroom scale and the like. This type of force sensor typically has an operation input unit constituted as a button type or a stick type to serve as a man-machine interface and is used, for example, as a stick type input device of a notebook type personal computer.

FIG. 1 and FIG. 2 show the outline of a general force sensor of the prior art, wherein FIG. 1(A) shows its plan view, FIG. 1(B) shows its IB-IB cross section, FIG. 1(C) shows its detection electrode, FIG. 2(A) shows its plan view, FIG. 2(B) shows its IIB-IIB cross section, and FIG. 2(C) shows its detection electrode. A force sensor 2 has a structure 6 consisting of insulators such as silicon rubber and conductors provided on a substrate 4, as well as an electrode 8 on the ceiling of the structure 6 and a detection electrode 10 facing the electrode 8 on the side of the substrate 4. If the electrode is made of the conductor of the structure 6, it is not necessary to provide the electrode 8 independently. The difference here is that the device shown in FIG. 1 has a structure 6 formed as a beam supported on both ends and a circular detection electrode 10, while the device shown in FIG. 2 has a structure 6 formed as a cantilever beam and a rectangular detection electrode 10.

The description of such a force sensor 2 can be tried using the force sensor 2 shown in FIG. 1 as an example, wherein a force "f" applied on the structure 6 causes the structure 6 to deform as shown in FIG. 3(A), which in turn reduces the electrode distance "d" and eventually causes the electrode 8 to contact the detection electrode 10 as shown in FIG. 3(B), increasing the capacitance between the electrodes "C." The relation between the input (force "f") of the structure 6 and the output (capacitance "C") varies in a smooth curve as shown in FIG. 4. COffset is the capacitance between the electrodes in the condition shown in FIG. 1(B), i.e., the offset output when the electrode distance "d" has not changed, and this offset output indicates that the capacitance does not change with the force "f" unless the force "f" does not exceed the elasticity limit of the structure 6, i.e., it represents the zero point output. This offset output depends on the elasticity, restoring capability, permanent strain, etc., of the structure 6. The same input/output relation exists for the force sensor 2 shown in FIG. 2.

A sensor that provides the change of capacitance C as an output relative to the force "f" applied is disclosed by JP-A-6-314163.

A capacitance type sensor disclosed in said document has a substantial displacement of the input part, and is constituted with two substantial substrates provided in parallel positions to allow them to move in parallel to each other, where electrodes are provided on their opposing surfaces respectively and positioned at 90° angles to each other.

The reliability of the input-output relation is critical in case of such a force sensor, in particular, the stability of said zero point output (offset output) is extremely important. Therefore, it is necessary for the output to be zero or present a specific offset value and the value is constant when it is not operated. In other words, the reliability of the detection device will be lost if the output varies or the offset value varies when it is not operated, making it impossible to determine the zero point.

For example, a pointing device using a force sensor may cause such a problem that a minute output signal causes to move the pointer when the zero point or the offset value changes when there is no operation. For example, a case has been reported that a pointer started to move by merely receiving air from an air conditioner unit entirely unrelated to the user's intention.

The input/output relation of the force sensor requires that there is a certain relation between input and output, it is extremely difficult to distinguish the output drift due to the environmental change and the output change due to a minute input when a minute force is to be detected under a condition where there are output drift due to changes in environmental factors such as temperature. Trying to stabilize the output against changes in environmental factors such as temperature tends to be expensive.

Certain variances are typically expected for a force sensor's zero point output (offset output), which varies with each force sensor, so that it is meaningless to try to set the output value uniformly. Therefore, what is commonly done is to store the value when the power source voltage is turned on as the zero point value forcibly in a memory or to store the zero point value (offset voltage value, etc.) in an involatile memory at the time of adjustment prior to the factory shipment for each force sensor. A problem with forcibly storing the value when the power is turned on as the zero point value is that a value different from the true value can be recorded as the zero value in such a case as when the operator's finger is touching the unit by mistake. A problem with the use of an involatile memory device for storing the zero point value at the time of a factory shipment is that it means an additional cost. In any case, the zero point value at the time of storage can be affected by changes of environmental factors such as temperature and humidity, so that it is impossible to follow such zero point fluctuations.

Although it is effective in saving power in a system using a force sensor to avoid powering the unit when there is no input to the power sensor, it makes it impossible to identify if there is an input or not unless the detection unit is powered. In order to avoid such an inconvenience, it is a common practice to power the unit intermittently.

Let us describe the method of zero point setting of the force sensor (FIG. 1 or FIG. 2) referring to FIG. 5. In FIG. 5(A), five inputs $f_1$, $f_2$, $f_3$, $f_4$, and $f_5$ are entered within a short spun of time, wherein the size relation between the inputs $f_1$ through $f_5$ is $f_2 > f_1 > f_3 \approx f_4 \approx f_5$, i.e., $f_2$ has the highest level, while $f_1$ and $f_2$ have the longest time span, and $f_3$, $f_4$ and $f_5$ are minute inputs of minute time spans. Moreover, it is assumed that minute inputs are entered after a gigantic input.

For such inputs $f_1$ through $f_5$, a force sensor 2 generates outputs $C_{11}$, $C_{12}$, $C_{13}$, $C_{14}$ and $C_{15}$ in correspondence with the inputs as shown in FIG. 5(B), i.e., showing changes of capacitance in correspondence with the input, a minute output is generated in the $b_1$ section after the output $C_{11}$ for the first input $f_1$ despite the fact that there is no input. This is the residual output. Moreover, a large residual output is generated in the $b_2$ section immediately after the output $C_{12}$ due to the input $f_2$. Since the outputs $C_{13}$ through $C_{15}$ are overlapping on said residual output and the inputs are smaller after $b_3$, it is understandable that the residual output reduces with time.

These residual outputs are dependant on the restoration capability of the structure 6 that receives pressures. Elastomer such as rubber used for the structure 6 has a property not to restore to its original shape after a deformation. The restoration property can be improved to a degree with a proper selection of material to reduce residual outputs but cannot eliminate them completely. When strong input changes occur and their time intervals are shorter, it is difficult to eliminate residual outputs.

A method of eliminating such residual outputs has been proposed in which a dead zone region for not allowing the residual outputs to be responded is set up near the zero point and forcing the output range of the dead zone region to be assigned to the zero point as shown in FIG. 5(C). FIG. 5(D) shows the outputs $C_{110}$, $C_{120}$, $C_{130}$, $C_{140}$, ($C_{150}$) that have levels lowered as a result of compensations due to the dead zone region setup. When such a dead zone region is set up, it eliminates the problem of residual outputs but it affects the input/output relation at the same time. In a comparison between the output (B) where the dead zone region is not set up, and the output (D) where the dead zone region is set up, the delay time td will be generated between the input and the output, thus deteriorating the time-related response. Moreover, the minute output $C_{15}$ can become buried into the dead zone level and may not generate any output ("d" section), thus deteriorating the level-related response. The forced zero point setup according to the dead zone region setup may deteriorate the detection sensitivity and the input relation and affect the reliability of the force sensor.

There is no mention of such a problem and no disclosure or suggestion is made as a means of solution for it in the above-mentioned prior art document.

SUMMARY OF THE INVENTION

Thus, the present invention relates to a force sensor that converts a force into capacitance and is intended to provide a force sensor that makes it possible to generate a plurality of outputs with different output characteristics.

The present invention also relates to the output processing of a force sensor that converts a force into capacitance to make it possible to obtain a plurality of outputs from a single input and to use other outputs as reference information for obtaining an output in order to increase the output accuracy.

The present invention is equipped with a plurality of sensor units on a common displacement unit so that it obtains an output from each sensor unit individually with referring to other outputs, thus making it possible to eliminate the offset of the displacement unit and to set up the zero point, so that it can improve the output accuracy.

In order to achieve the above objective, the force sensor of the present invention has a displacement unit that displaces when a force is applied, a single or a plurality of first sensor units that generates a first output from the displacement of said displacement unit, and a second sensor unit that is annexed to said first sensor unit and generates a second output from the displacement of said displacement unit.

With such a constitution having the first and the second sensors that operates based on the common displacement unit, the first and second sensor units will provide the first and second independent outputs from the displacement generated by an applied force. These two outputs can be used as reference information as complimentary or compensative data to each other. The first and second sensor units can both consist of either a single or plural sensors.

In order to achieve the above objective, the force sensor can be constituted in such a way as the displacement of said displacement unit includes either a deformation of said displacement unit or a movement of said displacement unit by force or both thereof.

In order to achieve the above objective, the force sensor can be constituted in such a way as the output of said second sensor unit rises steeply from the output of said first sensor unit and shifts to a saturated state ahead of the output of said first sensor unit. With such a constitution, the second output can be used as input information, for example, to indicate that a force is applied to the displacement unit. Said output can be used as the zero point information of the first output.

In order to achieve the above objective, the force sensor can be constituted in such a way as said second sensor is provided in the center of said displacement unit, while said first sensor unit is provided to surround said second sensor.

In order to achieve the above objective, the force detection system of the present system has a force sensor equipped with first and second sensor units in a displacement unit that displaces when a force is applied and generates first and second outputs that represent the displacement of said displace unit, and a processing unit that obtains said first output using said second output of said force sensor as the reference information for said first output.

With such a constitution, the displacement unit is equipped with the first and second sensors, so that it generates a displacement when subjected to a force and is possible to generate the first output from the first sensor unit and the second output from the second sensor unit independently. While each output can be used independently, they have a relation of being mechanically and simultaneously generated because they share a common displacement unit. Therefore, it is possible to use the second output as reference data in generating the first output. For example, if it is used as the time information or the level information, it is possible to conduct a process of generating the first output within the time the second output is generated referencing the time the second output is generated, or generating the first output if the second output's level exceeds a specified value. With such a constitution, the reliability of the first output can be enhanced using the correlation between the first and second outputs.

In order to achieve the above objective, the force detection system can also be constituted in such a way as said processing unit extracts time information representing level periods that exceed a specified level from said second output and obtains said first output referencing said time information.

In order to achieve the above objective, the force detection system can also be constituted in such a way as said second sensor unit of said force sensor shifts said second output to a saturated condition soon after said displacement unit starts to displace. For example, the system can be constituted in such a way that the second output saturates soon after the displacement of the displacement unit if the second output is to be used as the reference information of the first output.

In order to achieve the above objective, the force detection system can also be constituted in such a way as said reference information is zero point information of said first output. With such a constitution, it is possible to eliminate the output error and the offset due to the characteristic of the displacement unit using the second output as the zero point information of the first output, thus to increase the accuracy of the force detection and to obtain outputs in correspondence with manual inputs.

In order to achieve the above objective, the force detection program of the invention is constituted to include a function of obtaining a first output from a first sensor unit provided in a displacement unit that displaces when a force is applied, a function of obtaining a second output from a second sensor unit provided in said displacement unit, a function of extracting time information representing a level period that exceeds a specified level from said second output, and a function of obtaining said first output referencing said time information.

With such a constitution, it is possible to eliminate the output error and the offset due to the characteristic of the displacement unit as the first output is obtained referencing the second output, thus to increase the accuracy of the force detection and to obtain outputs in correspondence with manual inputs.

As can be seen from the above description, the present invention provides the following effects.

According to the force sensor of the present invention, it is possible to provide a force sensor of a high reliability with a highly accurate sensor output, as it is possible to obtain a plurality of outputs from a common displacement unit independently, referencing other outputs for obtaining one output, and using them as reference information for the purpose of compensating offset outputs between various outputs, etc.

According to the force detection system or the force detection program of the present invention, it is possible to compensate the first output using the second output as the reference information of the first output, thus to achieve a force detection with a high reliability by compensating for fluctuations of the force censor and output errors due to characteristic values of the material used in the displacement unit.

BRIEF DESCRIPTION OF THE DRAWINGS

FIG. 1 is a diagram showing a force sensor of the prior art.
FIG. 3 shows a diagram showing the deformation status of a force sensor in response to an input force.
FIG. 4 is a graph showing the input/output relation.
FIG. 9 is a diagram showing the input/output relation of a second sensor unit.
FIG. 12 is a diagram showing the input/output relations of the first and second sensor units.
FIG. 15 is a diagram showing the input/output relations of the first and second sensor units.
FIG. 17 is a diagram showing the input/output relations of the first and second sensor units.
FIG. 21 is a block diagram showing a tenth embodiment of the present invention.
FIG. 22 is a block diagram showing an eleventh embodiment of the present invention.
FIG. 23 is a diagram showing the detection operation of a force sensor according to the eleventh embodiment.
FIG. 24 is a diagram showing the input/output relations of the first and second sensor units.
FIG. 27 is a cross section showing variation of the second sensor unit.

DESCRIPTION OF THE PREFERRED EMBODIMENTS

First Embodiment

Figure 6:
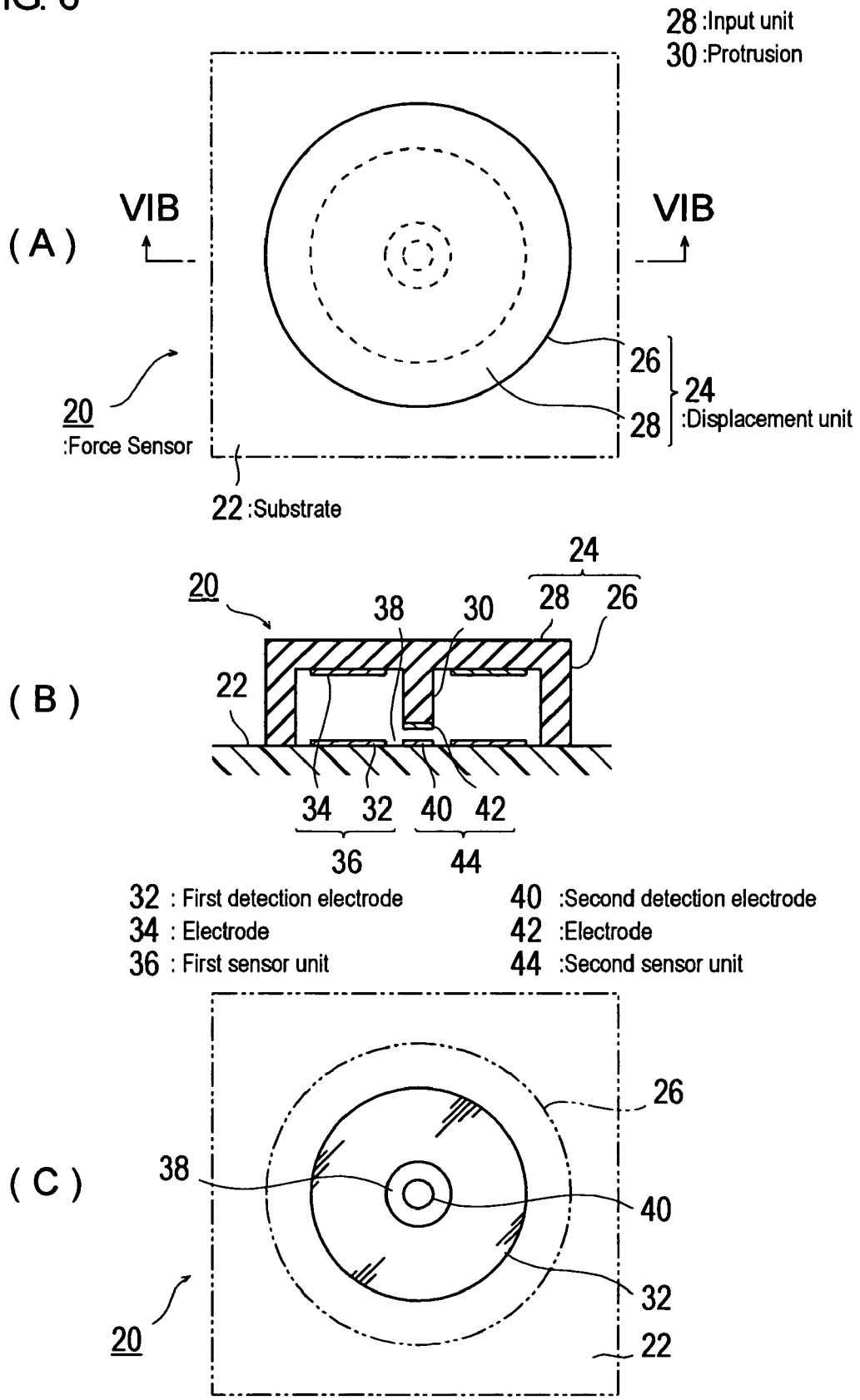
FIG. 6 is a diagram showing a first embodiment of the present invention.

The first embodiment of the present invention will be described below referring to FIG. 6. FIG. 6 shows a force sensor, wherein (A) is its plan view, (B) is a cross section along the VIB-VIB line of (A), and (C) is a plan view of the force sensor showing it without the displacement unit.

This force sensor 20 is equipped with a displacement part 24, which is mounted on a substrate 22, for generating a displacement when an external force is applied, the displacement part 24 is equipped with a cylindrical support part 26, which is flexible in the vertical direction in this embodiment, an tabular input part 28 integrally formed with the support part 26, and a columnar protrusion 30 in the inner center of the input part 28. The displacement part 24 is made of an elastic material such as rubber or metallic so that it can deform when an external force is applied and restore its original form when the force is removed.

An annular shaped detection electrode 32 is mounted on the substrate 22 as a first detection electrode, while an electrode 34 with a shape identical to the detection electrode 32 is provided on the inner surface of the input part 28 facing the detection electrode 32. The detection electrode 32 and the electrode 34 constitute a first sensor unit 36. The sensor unit 36 is constituted in such a way that, assuming the opposing area $S_1$ of the detection electrode 32 and the electrode 34 is constant, it generate capacitance $C_1$ in response to a force f as the electrode distance $d_1$ changes under the force f. Although the detection electrode 32 and the electrode 34 are assumed to be annular, they can be rectangular as well.

A circular detection electrode 40 is provided as a second detection electrode inside the detection electrode 32 separated by an insulation distance 38. An electrode 42 is provided on the tip of the protrusion 30 to face the detection electrode 40. The detection electrode 40 and the electrode 42 constitute a second sensor unit 44. The sensor unit 44 is constituted in such a way that, assuming the opposing area $S_2$ of the detection electrode 40 and the electrode 42 is constant, it generate capacitance $C_2$ in response to a force f as the electrode distance $d_2$ changes under the force f. The electrode distance $d_2$ for the sensor 44 is smaller than the electrode distance $d_1$ for the sensor 36 by the length of the protrusion 30 ($d_1 > d_2$). Although the detection electrode 40 and the electrode 42 are assumed to be circular, they can be rectangular as well.

Figure 7:
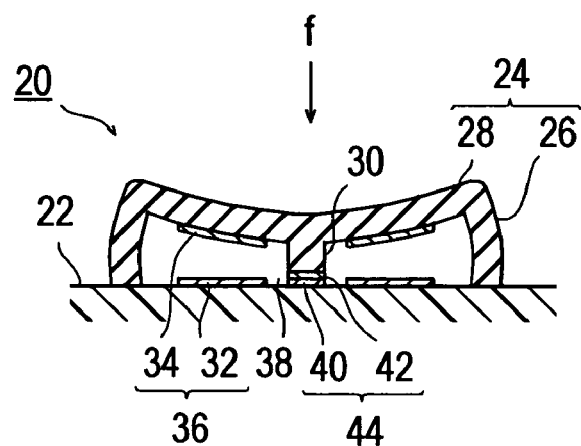
FIG. 7 is a diagram showing the deformation of a force sensor according to the first embodiment.

According to such a constitution, when a force f is applied by, for example, a finger on the input part 28 of the displacement part 24 of the force sensor 20, the displacement part 24 deforms corresponding to the force f and the input part 28, as well as the support part 26, bends as shown in FIG. 7, causing the detection electrode 32 to approach the electrode 34 while the electrode 42 of the protrusion 30 to approach the detection electrode 40 until finally making a contact. In this case, since the gap between the detection electrode 40 and the electrode 42 is small, the electrode 42 makes a contact with the detection electrode 40 soon after the input part 28 starts a displacement. Such a displacement causes the sensor unit 36 to generate capacitance $C_1$ in accordance with the facing area $S_1$ and the electrode distance $d_1$ and the sensor unit 44 to generate capacitance $C_2$ as the output of the second sensor in accordance with the facing area $S_2$ and the electrode distance $d_2$.

Figure 8:
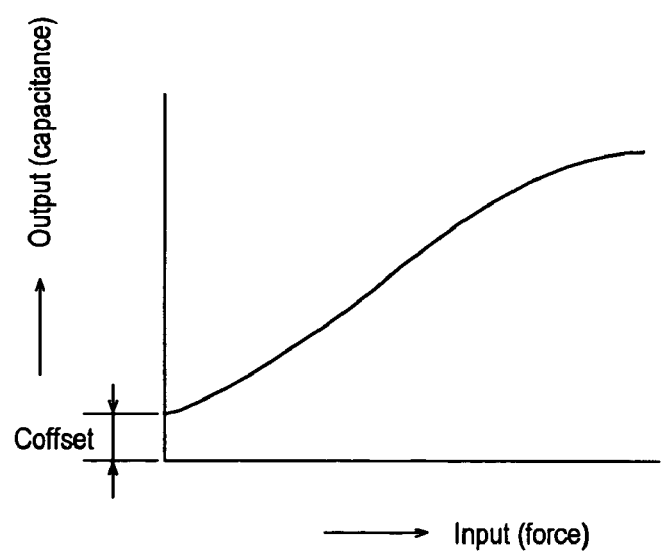
FIG. 8 is a diagram showing the input/output relation of a first sensor unit.

The input/output relation of the sensor unit 36 appears as a smooth change of the capacitance $C_1$ relative to the input f as shown in FIG. 8. In this case, the offset output $C_{offset}$ is the output of the sensor unit 36 before the input part 28 is deformed.

On the contrary, the input/output relation of the sensor unit 44 generates output change only in a small input range as shown in FIG. 9(A) as the detection electrode 40 abuts with the electrode 42 and saturates soon after the displacement of the input unit 28 starts. Enlargement of the input/output relation shown in FIG. 9(A), reveals, as shown in FIG. 9(B), that the sensor unit 44 saturates with a smaller input compared to the sensor unit 36 so that the sensor unit 44 can be used primarily for the detection of a minute force f. In other words, the output of the sensor unit 44 can provide the output in the vicinity of the zero point of the force sensor 20.

Second Embodiment

Figure 10:
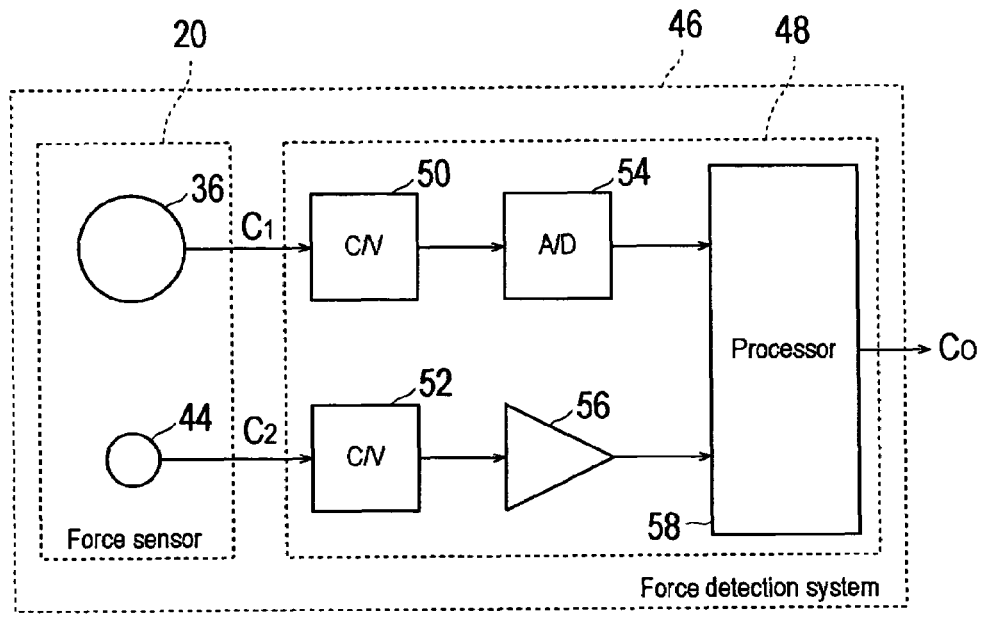
FIG. 10 is a block diagram showing a second embodiment of the present invention.

The second embodiment of the present invention will be described below referring to FIG. 10. FIG. 10 is a block diagram showing the force detection system using a force sensor.

This force detection system 46 is equipped with the aforementioned force sensor 20 and is constituted in such a way that the sensor output $C_1$ of the sensor part 36 and the sensor output $C_2$ of the sensor 44 of the second sensor 20 are entered into the output processing unit 48 respectively, and sensor output $C_1$ is compensated using the sensor output $C_2$ as reference information such as zero point compensation information and the like to generate the detection output $C_0$ corresponding to the force f. In this case, the output processing unit 48 is equipped with capacitance/voltage (C/V) converters 50 and 52 for the outputs $C_1$ and $C_2$ respectively and an analog/digital (A/D) converter 54 provided on the sensor output $C_1$ side, and a comparator 56 provided on the sensor output $C_2$ side. The outputs of these A/D converter 54 and comparator 56 are entered into a processor 58. The processor 58 can be constituted with one chip microcomputers, etc.

With such a constitution, the output $C_1$ (FIG. 8) of the sensor unit 36 is entered into the C/V converter 50 to be converted into a voltage, an analog value, then converted to a digital signal by the A/D converter 54, and entered into the processor 58.

The output $C_2$ (FIG. 9) of the sensor unit 44 is entered into the C/V converter 52 to be converted into a voltage, which is then entered into the comparator 56, while the comparator 56 generates a switching output when the voltage value exceeds a predetermined level $V_{ref}$. This output is entered into the processor 58.

The processor 58 is equipped with a CPU (Central Processing Unit) as a means of arithmetic processing means and a ROM (Read Only Memory) as a means of storing programs and data; the output of the comparator 56 based on the sensor output $C_2$ is used as reference information for the zero point compensation of the sensor output $C_1$, and the offset output is eliminated from the sensor output $C_1$ to obtain a highly accurate detection output $C_0$ in correspondence with the input.

Third Embodiment

Figure 11:
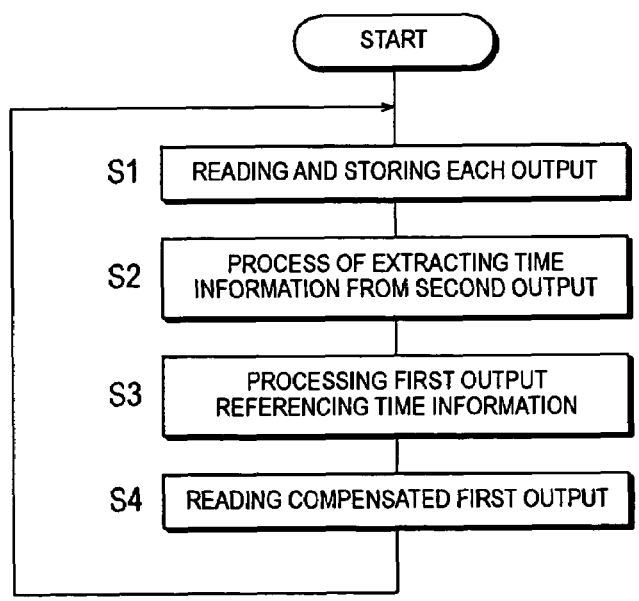
FIG. 11 is a flowchart showing a third embodiment of the present invention.

The third embodiment of the present invention will be described below referring to FIG. 11. FIG. 11 is a flow chart of an example of the force detection program used for the output processing of the processor 58.

The force detection program reads and stores the first output $C_1$ of the sensor unit 36 and the second output $C_2$ of the sensor unit 44 (step S1). Since the output $C_2$ develops level changes in response to the input f, the time information representing the periods of levels exceeding a specified level is extracted from the output $C_2$ based on said level changes and their time relations (step S2). The output $C_1$ is compensated with reference to said time information (step S3) in order to obtain the compensated output $C_1$ (step S4).

Since the force sensor 20 (FIG. 6) is provided with the two sensor units 36 and 44 for a single displacement part 24, meaning that a single input is fed to the two sensor units 36 and 44, the outputs $C_1$ and $C_2$ are generated simultaneously. If the time information extracted from the output $C_2$ is used as a reference for obtaining an output from the output $C_1$, an output with a certain zero point level, void of the offset output, can be achieved.

Figure 2:
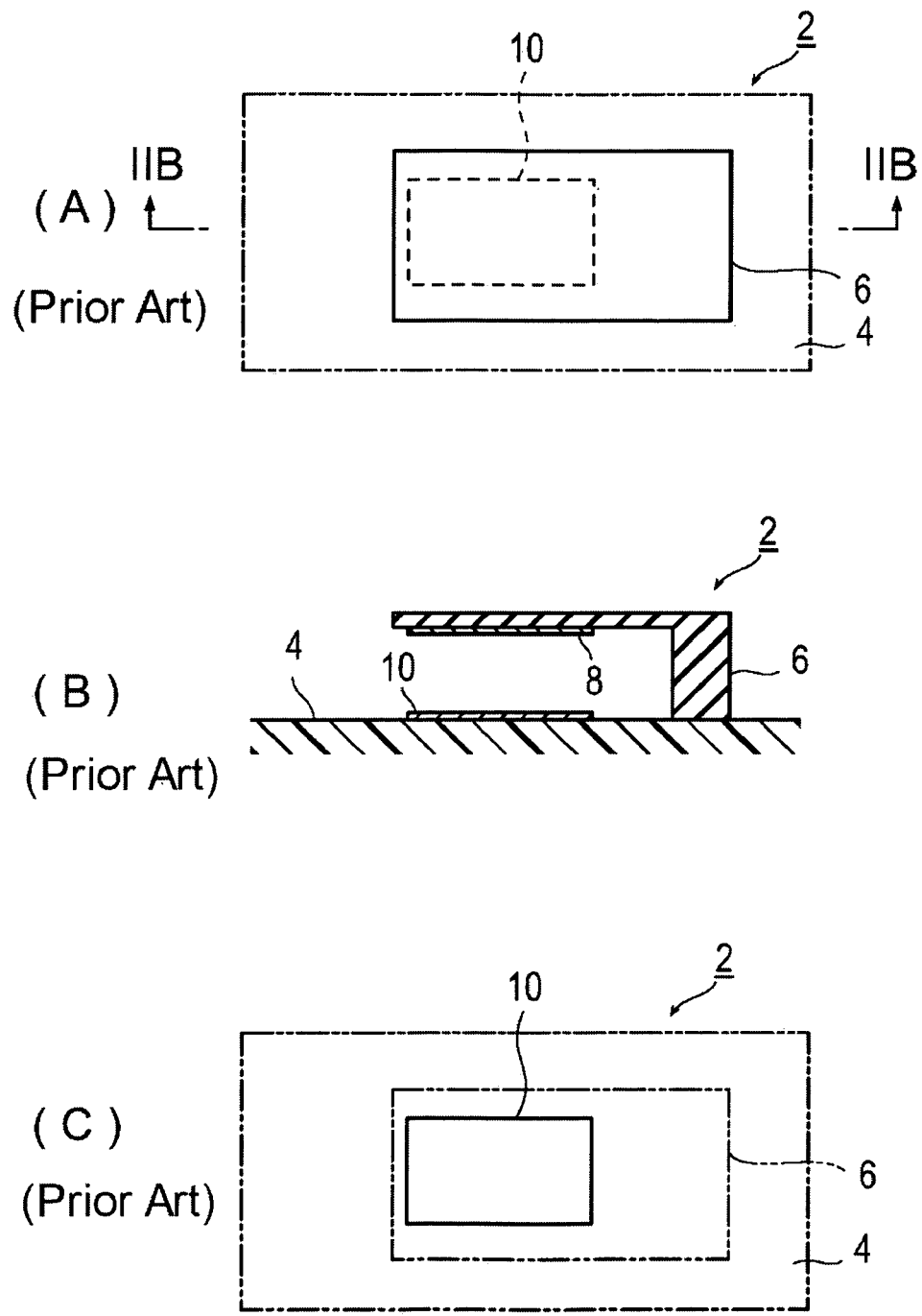
FIG. 2 is a diagram showing another force sensor of the prior art.
Figure 5:
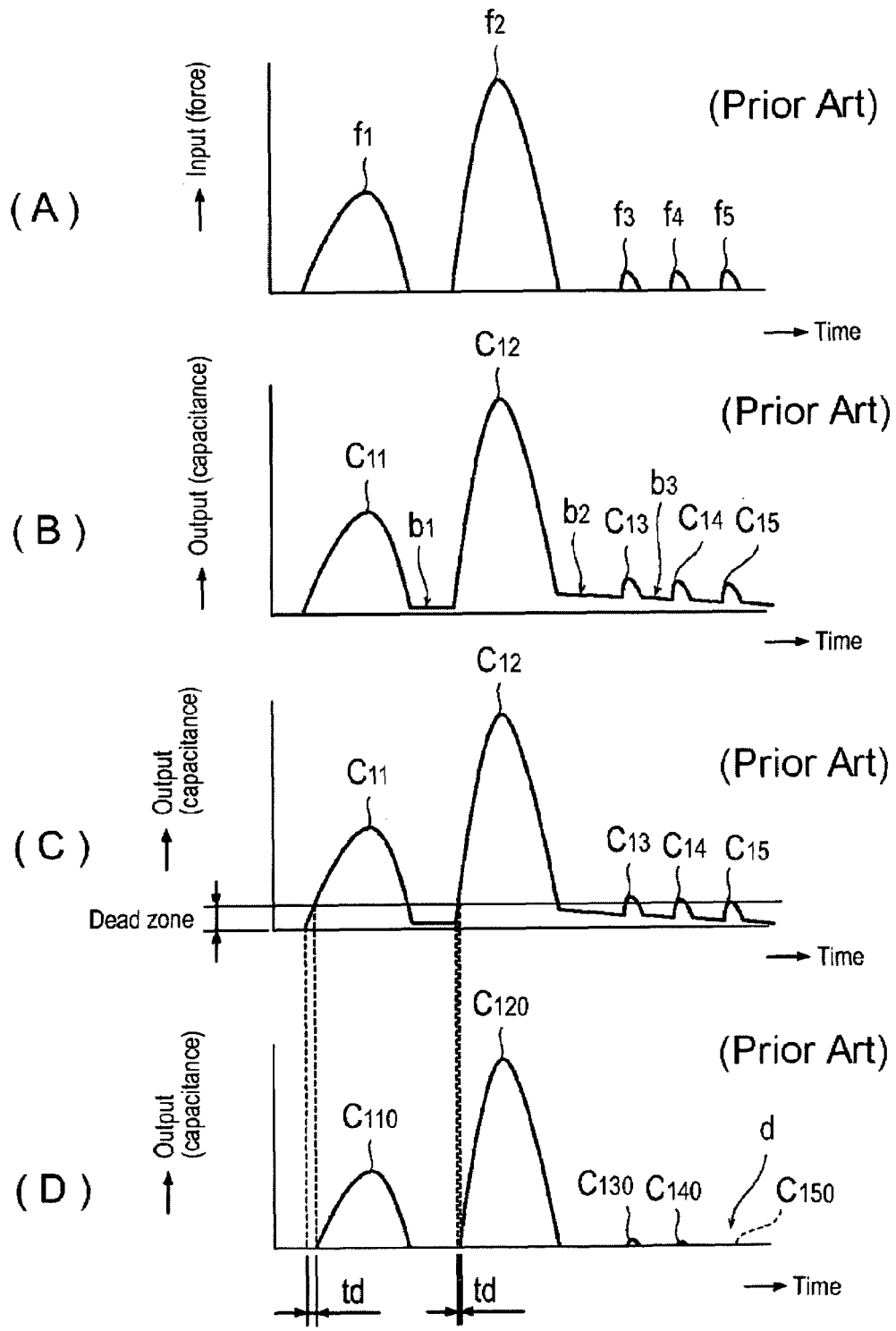
FIG. 5 is a graph showing the input/output relation.

Next, the output process based on this force detection system and the force diction program will be described referencing FIG. 12. FIG. 12 is a record that corresponds to the record shown in FIG. 5, wherein (A) shows a plurality of inputs of different levels applied with relatively short time periods, (B) shows the output of the first sensor unit, (C) shows the output of the second sensor unit, (D) shows the compensation process for the first output, and (E) shows the compensated output.

In FIG. 12(A), five inputs $f_1$, $f_2$, $f_3$, $f_4$, and $f_5$ are those that are continuously entered, wherein the size relation between the inputs $f_1$ through $f_5$ is $f_2 > f_1 > f_3 \approx f_4 \approx f_5$, i.e., $f_2$ has the highest level, while $f_1$ and $f_2$ have the longest time span, and $f_3$, $f_4$ and $f_5$ are minute inputs of minute time spans.

For such inputs $f_1$ through $f_5$, a force sensor 36 generates outputs $C_{11}$, $C_{12}$, $C_{13}$, $C_{14}$ and $C_{15}$ as shown in FIG. 12(B) in correspondence with the input/output relation shown in FIG. 8, i.e., showing changes of capacitance in correspondence with the input, a minute output is generated in the "$b_1$" section after the output $C_{11}$ for the first input $f_1$ despite the fact that there is no input. This is the residual output. Moreover, a larger residual output is generated in the $b_2$ section immediately after the output $C_{12}$ due to the input $f_2$, reflecting the large size of the input f2. Since the outputs $C_{13}$ through $C_{15}$ are overlapping on said residual output and the inputs are smaller after $b_3$, thus reducing the residual output with time. These processes are similar to FIG. 5 and its description.

The sensor unit 44 generates the outputs $C_{21}$, $C_{22}$, $C_{23}$, $C_{24}$ and $C_{25}$ as shown in FIG. 12(C) in correspondence with the input/output relation as shown in FIG. 9. The reason why the levels of the outputs $C_{21}$ and $C_{22}$ are lower than those of the outputs $C_{11}$ and $C_{12}$ is that the facing area on the side of the detection electrode 40 is smaller compared to the detection electrode 32, and a saturation condition is achieved by the contact between the electrodes. The reason why the outputs $C_{13}$ through $C_{15}$ reduces more slowly on the removal side of the input forces $f_1$ through $f_5$ while the outputs $C_{23}$ through $C_{25}$ changes more sharply and their time intervals are substantially even is that they are dependant on the mechanical shape restoration characteristic of the displacement unit 24, the support part 26 returning to its initial state first, then he protrusion 30 returning to the initial state.

In this embodiment, therefore, an output level $C_{ns}$ is established to correspond with the dead zone regions of the outputs $C_{21}$ through $C_{25}$ as shown in FIG. 12(C), assigning an output time period $t_h$ (=1) for the periods where the output level exceeds that of the output $C_{ns}$ and an output zero time $t_0$ (=0) for the remaining periods. Therefore, it is "1" during the periods of times $t_1$, $t_2$, $t_3$, $t_4$, and $t_5$, while it is "0" in the remaining periods. If the outputs $C_{11}$ through $C_{15}$ are to be obtained in each output time period $t_h$ respectively, by multiplying the time information "1" representing these outputs $C_{11}$ through $C_{15}$ and the time information "0" for other periods with the outputs $C_{21}$ through $C_{25}$, it is possible to obtain $C_{11}$ through $C_{15}$ as the compensated outputs $C_{110}$ through $C_{150}$ as shown in FIG. 12(E). The compensated outputs $C_{110}$ through $C_{150}$ are then obtained as outputs matching with the inputs $f_1$ through $f_5$ shown in FIG. 12(A) and corresponding with each input level respectively, without accompanying the residual outputs as in the case of the outputs $C_{11}$ through $C_{15}$. Moreover, their zero points is uniform and their detection sensitivities and input/output relations are free from deteriorations due to the setting of dead zone periods as experienced in the prior art, and they maintain an input/output relation of a high reliability.

Although it is assumed in this embodiment to obtain the compensated outputs $C_{110}$ through $C_{150}$ by multiplying the time information extracted from the outputs $C_{21}$ through $C_{25}$ with the outputs $C_{11}$ through $C_{15}$, the system can be configured to obtain the compensated outputs $C_{110}$ through $C_{150}$ by putting the outputs $C_{11}$-$C_{15}$ through a gate means that passes signals during the periods with levels exceeding a specified level for the outputs $C_{21}$ through $C_{25}$. Also, it can also be constituted in such a way as to add or multiple the outputs $C_{11}$ through $C_{15}$ with the outputs $C_{21}$ through $C_{25}$ and use the resultant values above a certain level as the outputs.

Fourth Embodiment

Figure 13:
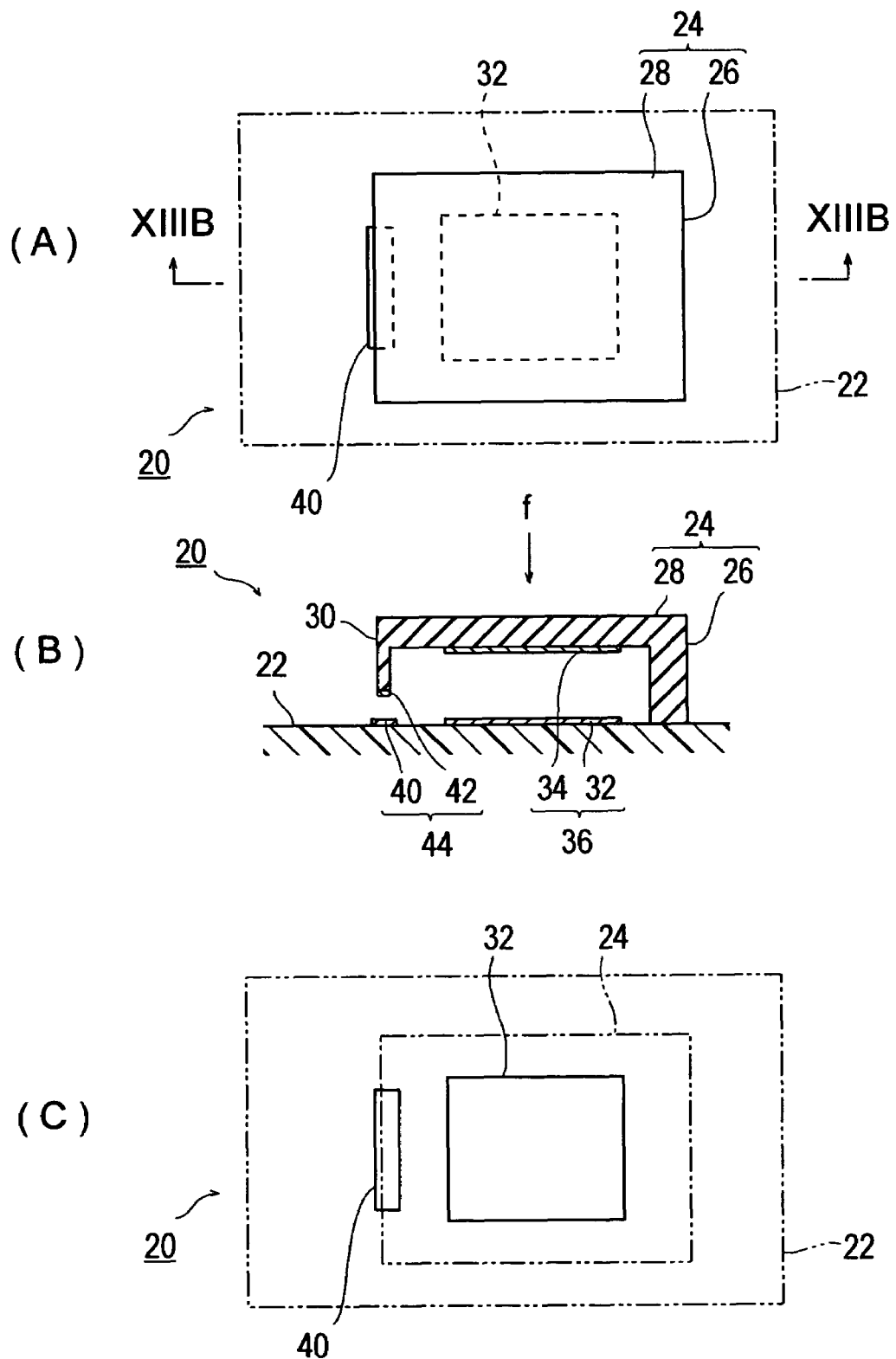
FIG. 13 is diagram showing a fourth embodiment of the present invention.

The fourth embodiment of the present invention will be described below referring to FIG. 13. FIG. 13 shows a force sensor according to the fourth embodiment, wherein (A) is its plan view, (B) is a cross section along the XIIIB-XIIIB line of (A), and (C) is a plan view of the force sensor showing it without the displacement cabinet.

The force sensor 20 concerning this embodiment is equipped with a displacement part 24 consisting of a cantilever beam, wherein the displacement part 24 is made of an elastic material and has a flat rectangle columnar support part 26 integrally formed with a rectangular input part 28. The input part 28 is supported by the support part 26 at one end and a columnar protrusion 30 is formed at the other end, which is the free end of the cantilever beam. A rectangular shaped detection electrode 32 is provided on a substrate 22, facing an electrode 34, which is provided on the inner surface of the input part 28, the detection electrode 32 and the electrode 34 thus constituting a first sensor unit 36. Also, a detection electrode 40 is formed on the top surface of the substrate 22 where it opposes the protrusion 30 facing an electrode 42, which is formed on the tip of the protrusion 30, the detection electrode 40 and the electrode 42 thus constituting a second sensor unit 44.

With such a constitution, it is possible, similar to the aforementioned force sensor 20 (FIG. 6) according to the first embodiment, to obtain the output $C_1$ (FIG. 8) from the sensor unit 36 according to the displacement of the displacement part 24 and the output $C_2$ (FIG. 9) from the sensor unit 44 corresponding with the force f. It is also possible to constitute a force detection system (FIG. 10) using this sensor 20, extract time information from the output $C_2$ using a similar force detection program (FIG. 11), and obtain an output $C_0$ void of residual output by executing a compensation process for the output $C_1$ using the time information (FIG. 12).

Fifth Embodiment

Figure 14:
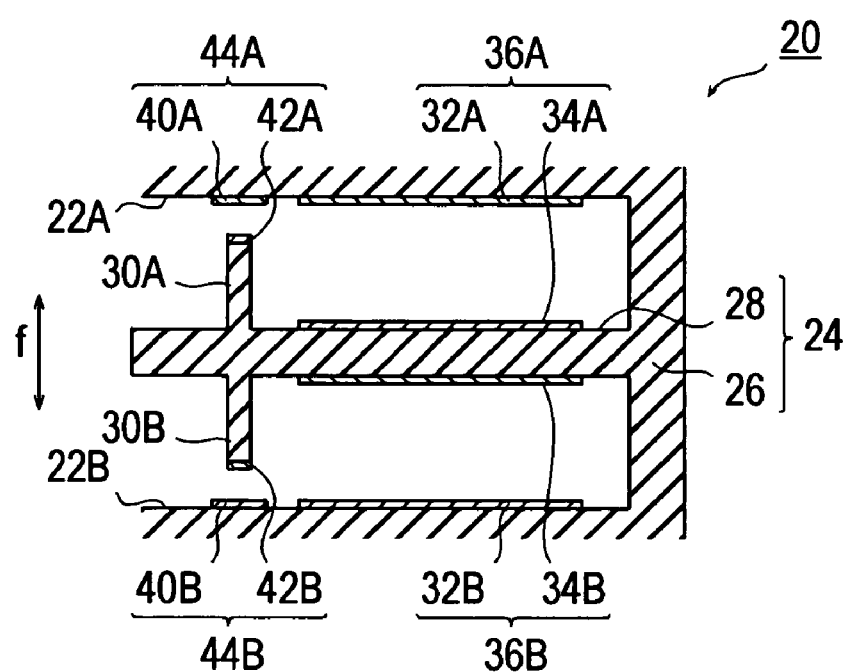
FIG. 14 is a cross section showing a fifth embodiment of the present invention.

The fifth embodiment of the present invention will be described below referring to FIG. 14. FIG. 14 is a vertical cross section showing a force sensor according to the fifth embodiment.

A force sensor 20 according to this embodiment is equipped with a displacement part 24 of a T-shaped cross section, and this displacement part 24 consists of a support part 26 and an input part 28. The distal end of the input part 28 is made a free end, and the displacement part 24 is made of an elastic material such as rubber having an appropriate elasticity. Therefore, the input part 28 is free to bend in the vertical direction as it receives a force f in the vertical direction, protrusions 30A and 30B are provided on the free end of the displacement part 24, extending in the vertical direction. Detection electrodes 32A and 32B are provided on substrates 22A and 22B respectively opposing the displacement part 24, while electrodes 34A and 34B are provided on the input part 28 facing detection electrodes 32A and 32B respectively, the detection electrode 32A and the electrode 34A as well as the detection electrode 32B and the electrode 34B thus constituting two first sensor units 36A and 36B. Also, an electrode 40A is provided on the substrate 22A opposing the protrusion 30A and an electrode 40B is provided on the substrate 22B opposing the protrusion 30B, while an electrode 42A is provided on the protrusion 30A opposing the detection electrode 40A, an electrode 42B is provided on the protrusion 30B opposing the detection electrode 40B, the detection electrode 40A and the electrode 42A as well as the detection electrode 40B and the electrode 42B thus constituting two second sensor units 44A and 44B.

With such a constitution, the input part 28 displaces either to the up side or the down side according to the input f, the sensor unit 36A generates the output $C_{1A}$ in accordance with the input f, the sensor unit 36B generates the output $C_{1B}$ in accordance with the input f, while the sensor unit 44A generates the output $C_{2A}$ in accordance with the input f, the sensor unit 44B generates the output $C_{2B}$ in accordance with the input f. FIG. 15(A) shows the trends of the outputs $C_{1A}$ and $C_{1B}$, while FIG. 15(B) shows the trends of the outputs $C_{2A}$ and $C_{2B}$. The outputs $C_{2A}$ and $C_{2B}$ of the sensor units 44A and 44B reach saturation status soon after the displacement part 24 starts to displace as mentioned previously.

In the force detection system 46 using the force sensor 20 according to the fifth embodiment (FIG. 14), one force sensor 20 is equipped with a pair of first and second sensor units 36A, 36B, 44A, and 44B, so that it is possible to obtain the compensated output $C_{0A}$ and $C_{0B}$ void of any residual output from the outputs $C_{1A}$ and $C_{1B}$ of the sensor units 36A and 36B as mentioned before by extracting time information from the outputs $C_{2A}$ and $C_{2B}$ using a similar force detection program (FIG. 11) constituting a pair of force detection systems 46 shown in FIG. 10 or through the use of a common processor 58, and executing the compensation process for the outputs $C_{1A}$ and $C_{1B}$ (FIG. 12).

Sixth Embodiment

Figure 16:
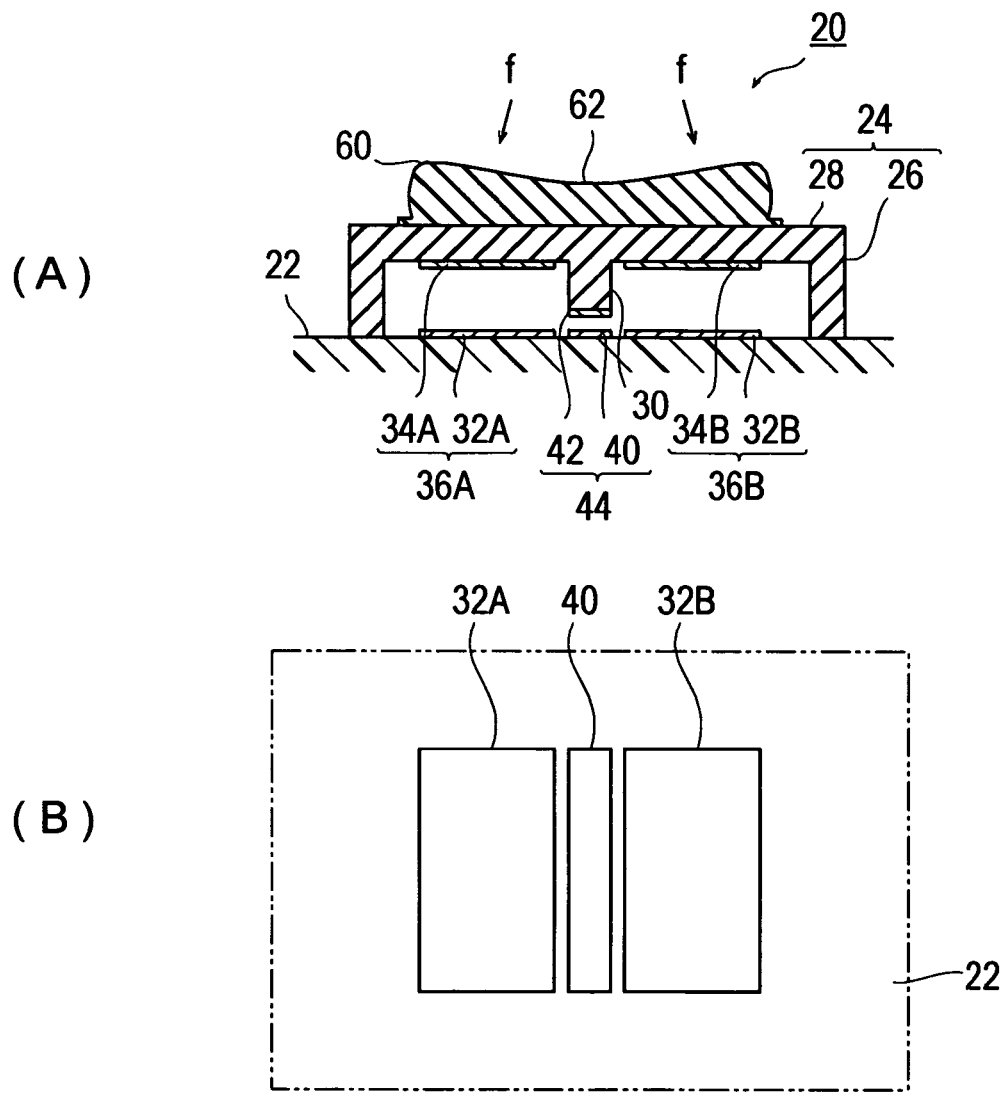
FIG. 16 is diagram showing a sixth embodiment of the present invention.

The sixth embodiment of the present invention will be described below referring to FIG. 16. FIG. 16 shows the force sensor according to the sixth embodiment, wherein (A) is its vertical cross section and (B) is its plan view showing the shape and layout of the detection electrodes.

The force sensor 20 according to this embodiment is equipped with a rectangular tubular displacement part 24 provided on the top surface of the substrate 22, which generates a displacement when an external force is applied, and the displacement part 24 is equipped with a flexible rectangular tubular support part 26, a rectangular flat plate-shaped input part 28 integrally formed with the support part 26, and a vertical wall-like protrusion 30 in the inner center of the input part 28. The displacement part 24 is made of an elastic material such as rubber or metallic so that it can deform when an external force is applied and restore its original form when the force is removed. An input pad 60 is provided on the top surface of the input part 28 of the displacement part 24, and a curved cavity 62 is formed on the top surface of the input pad 60 to facilitate the force input by a finger.

Rectangular detection electrodes 32A and 32B are provided as first detection electrodes on the substrate 22 on both sides of the protrusion 30, while electrodes 34A and 34B of identical shapes as the electrodes 32A and 32B are provided on the inner surface of the input part 28 facing said detection electrodes 32A and 32B. The detection electrode 32A and the electrode 34A constitute a sensor unit 36A, while the detection electrode 32B and the electrode 34B constitute a sensor unit 36B. A detection electrode 40 is provided on the substrate 22 facing the protrusion 30 and an electrode 42 is provided on the protrusion 30 facing said detection electrode 40, so that the detection electrode 40 and the electrode 42 constitute a sensor unit 44.

With such a constitution, the input part 28 displaces either to the up side or the down side according to the input f, the sensor unit 36A generates the output $C_{1A}$ in accordance with the input f, the sensor unit 36B generates the output $C_{1B}$ in accordance with the input f, while the sensor unit 44 generates the output $C_2$ in accordance with the input f. FIG. 17(A) shows the trends of the outputs $C_{1A}$ and $C_{1B}$, while FIG. 17(B) shows the trend of the output $C_2$. The output $C_2$ of the sensor unit 44 reaches a saturated state soon after the displacement part 24 starts to displace as mentioned before.

Seventh Embodiment

Figure 18:
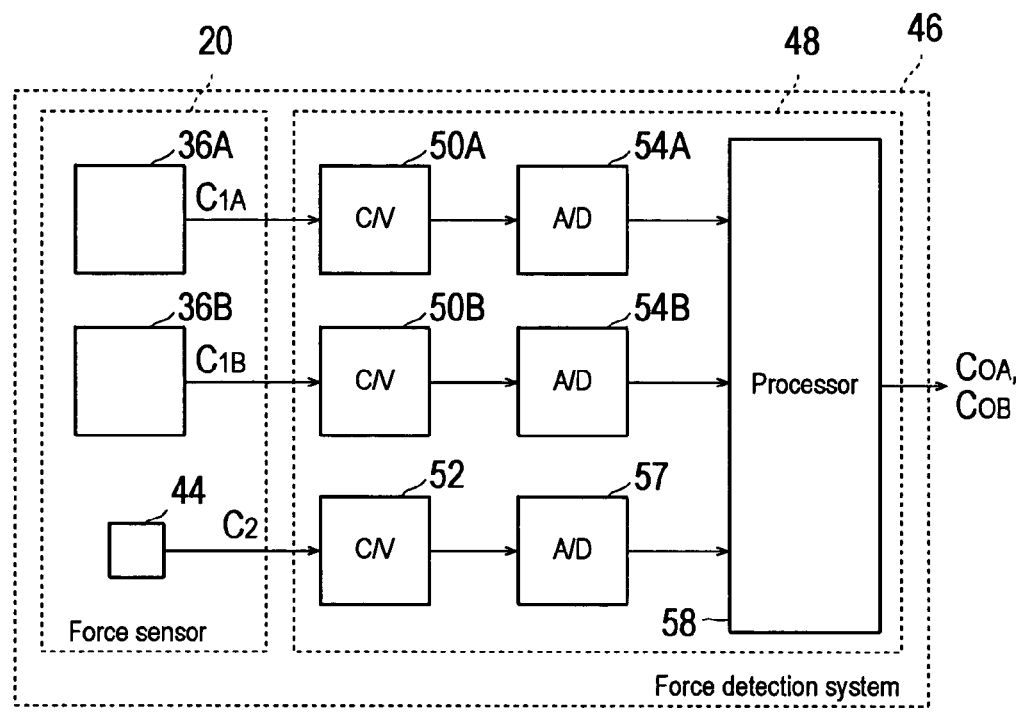
FIG. 18 is a block diagram showing a seventh embodiment of the present invention.

The seventh embodiment of the present invention will be described below referring to FIG. 18. FIG. 18 is a block diagram showing the force detection system using a force sensor according to the seventh embodiment. Those parts that are identical to those in the second embodiment are identified with identical code numbers.

This force detection system 46 uses the aforementioned force sensor 20 (FIG. 16) and it is constituted in such a way that the outputs $C_{1A}$ and $C_{1B}$ of the sensor units 36A and 36B as well as the output $C_2$ of the sensor unit 44 are entered into the processing unit 48 in order to obtain the compensated outputs $C_{OA}$ and $C_{OB}$ corresponding to the force f by compensating the outputs $C_{1A}$ and $C_{1B}$ using the output $C_2$ as the reference information such as the zero point compensation information. In this case, the output processing unit 48 is equipped with capacitance/voltage (C/V) converters 50A, 50B and 52 for the outputs $C_{1A}$, $C_{1B}$ and $C_2$ respectively as well as analog/digital (A/D) converters 54A and 54B provided on the sensor outputs $C_{1A}$ and $C_{1B}$ side respectively and an analog/digital (A/D) converter 57 provided on the sensor output $C_2$ side. The outputs of these A/D converters 54A, 54B, and 57 are entered into the processor 58. The A/D converter 57 can be constituted of a comparator as in the second embodiment (FIG. 10).

With such a force detection system 46, it is possible to extract the aforementioned time information from the output $C_2$ and use this to execute the compensation of the outputs $C_{1A}$ and $C_{1B}$ (FIG. 12) in order to obtain the compensated outputs $C_{OA}$ and $C_{OB}$ void of any residual output from the outputs $C_{1A}$ and $C_{1B}$ of the sensor units 36A and 36B.

Eighth Embodiment

Figure 19:
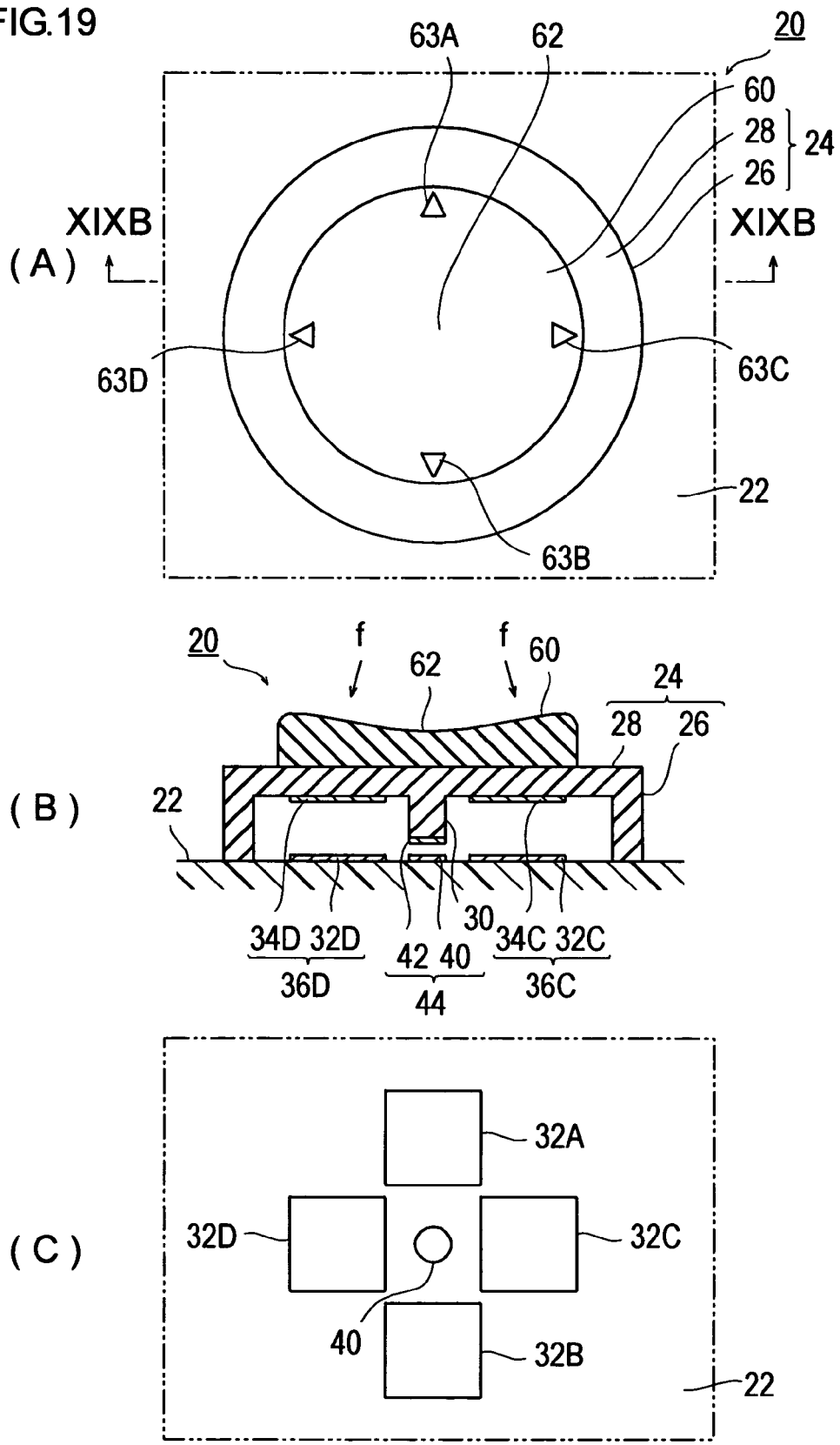
FIG. 19 is diagram showing a eighth embodiment of the present invention.

The eighth embodiment of the present invention will be described below referring to FIG. 19. FIG. 19 shows a force sensor according to the eighth embodiment, wherein (A) is its plan view, (B) is a cross section along the XIXB-XIXB line of (A), and (C) is a plan view of the detection electrode on the substrate showing the shapes and layout of the detection electrodes.

The force sensor 20 according to this embodiment is equipped with a cylindrical displacement part 24 provided on the substrate 22, and the displacement part 24 is equipped with a flexible cylindrical-tubular support part 26, a circular flat plate-shaped input part 28 integrally formed with the support part 26, and a cylindrical protrusion 30 provided in the inner center of the input part 28. The displacement part 24 is made of an elastic material such as rubber or metallic so that it can deform when an external force is applied and restore its original form when the force is removed. A circular input pad 60 is provided on the top surface of the input part 28 of the displacement part 24, and a curved cavity 62 is formed on the top surface of the input pad 60 to facilitate the force input by a finger. Triangular marks 63A, 63B, 63C and 63D provided on the top surface of the input pad 60 corresponds to the positions of the detection electrodes 32A, 32B, 32C and 32D to be described later respectively.

Square detection electrodes 32A, 32B, 32C and 32D are provided as first detection electrodes on the substrate 22 surrounding the protrusion 30, while electrodes 34A, 34B, 34C and 34D of shapes identical to the detection electrodes 32A through 32D are provided on the inner surface of the input part 28 facing said detection electrodes 32A, 32B, 32C and 32D. These detection electrodes 32A through 32D and electrodes 34A through 34D constitute sensor units 36A, 36B, 36C and 36D. A detection electrode 40 is provided on the substrate 22 facing the protrusion 30 and an electrode 42 is provided on the protrusion 30 facing said detection electrode 40, so that the detection electrode 40 and the electrode 42 constitute a sensor unit 44.

With such a constitution, the input part 28 displaces either to the up side or the down side according to the input f, the sensor units 36A through 36D generate the outputs $C_{1A}$, $C_{1B}$, $C_{1C}$ and $C_{1D}$ in accordance with the input f, while the sensor unit 44 generates the output $C_2$ in accordance with the input f. The output $C_2$ of the sensor unit 44 reaches a saturated state soon after the displacement part 24 starts to displace as mentioned before

Ninth Embodiment

Figure 20:
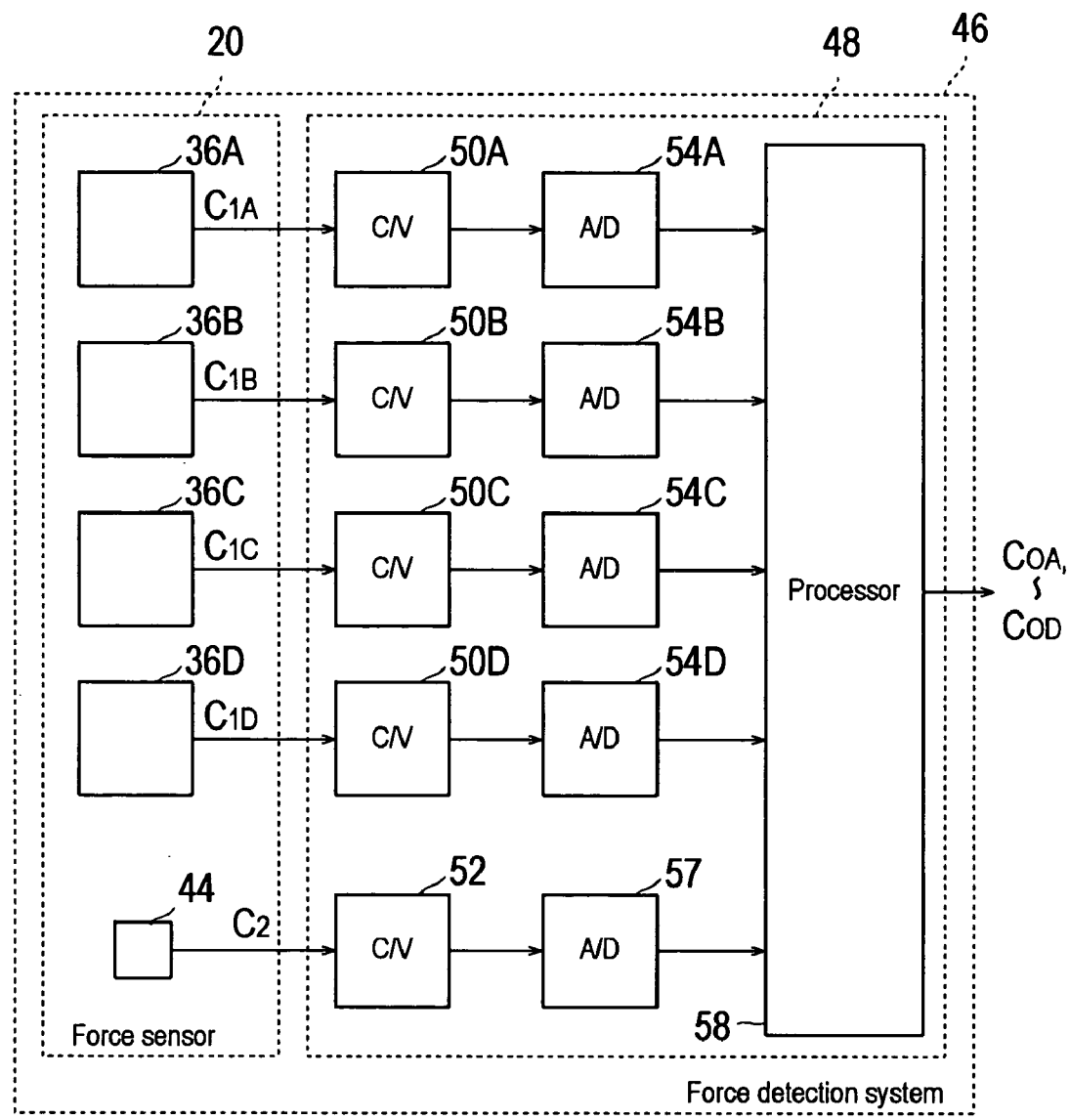
FIG. 20 is a block diagram showing a ninth embodiment of the present invention.

The ninth embodiment of the present invention will be described below referring to FIG. 20. FIG. 20 is a block diagram showing the force detection system using a force sensor according to the ninth embodiment. Those parts that are identical to those in the second embodiment are identified with identical code numbers.

This force detection system 46 uses the aforementioned force sensor 20 (FIG. 19) and it is constituted in such a way that the outputs $C_{1A}$, $C_{1B}$, $C_{1C}$ and $C_{1D}$ of the sensor units 36A, 36B, 36C and 36D as well as the output $C_2$ of the sensor unit 44 are entered into the processing unit 48 in order to obtain the compensated outputs $C_{OA}$, $C_{OB}$, $C_{OC}$ and $C_{OD}$ corresponding to the force f by compensating the outputs $C_{1A}$ through $C_{1D}$ using the output $C_2$ as the reference information such as the zero point compensation information. In this case, the output processing unit 48 is equipped with capacitance/voltage (C/V) converters 50A, 50B, 50C, 50D and 52 for the outputs $C_{1A}$ through $C_{1D}$ and $C_2$ respectively as well as analog/digital (A/D) converters 54A, 54B, 54C and 54D provided on the sensor outputs $C_{1A}$ through $C_{1D}$ side respectively and an analog/digital (A/D) converter 57 provided on the sensor output $C_2$ side. The outputs of these A/D converters 54A through 54D, and 57 are entered into the processor 58. The A/D 57 converter can be constituted of a comparator as in the second embodiment (FIG. 10).

With such a detection system 46, it is possible to extract the aforementioned time information from the output $C_2$ and use this to execute the compensation of the outputs $C_{1A}$ through $C_{1D}$ (FIG. 12) in order to obtain the compensated outputs $C_{OA}$, $C_{OB}$, $C_{OC}$ and $C_{OD}$ void of any residual output from the outputs $C_{1A}$ through $C_{1D}$ of the sensor units 36A and 36B.

Tenth Embodiment

The tenth embodiment of the present invention will be described below referring to FIG. 21. FIG. 21 shows a force sensor according to the tenth embodiment, wherein (A) is its plan view, (B) is a cross section along the XXIB-XXIB line of (A), and (C) is a plan view of the detection electrode on the substrate showing the shapes and layout of the detection electrodes. Those parts that are identical to those in the eighth embodiment are identified with identical code numbers.

The force sensor 20 according to this embodiment is equipped with a cylindrical displacement part 24 provided on the substrate 22, and the displacement part 24 is equipped with a flexible cylindrical-tubular support part 26, a circular flat plate-shaped input part 28 integrally formed with the support part 26, a cylindrical first protrusion 30 provided in the inner center of the input part 28, and another cylindrical protrusion 31 provided to surround the protrusion 30 concentrically. The displacement part 24 is made of an elastic material such as rubber or metallic so that it can deform when an external force is applied and restore its original form when the force is removed. A circular input pad 60 is provided on the top surface of the input part 28 of the displacement part 24, and a curved cavity 62 is formed on the top surface of the input pad 60 to facilitate the force input by a finger.

Similar to the aforementioned embodiments, the detection electrodes 32A through 32D formed on the substrate 22 and the electrodes 34A through 34D constitute the sensor units 36A through 36D. A dome switch 64 is provided on the substrate 22 facing the protrusion 30, while a detection electrode 40 is provided around the dome switch 64 to face a protrusion 31 and an electrode 42 is provided on the protrusion 31 facing said detection electrode 40, the detection electrode 40 and electrode 42 thus constituting a sensor unit 44.

With such a constitution, the input part 28 displaces either to the up side or the down side according to the input f, thus allowing the sensor units 36A through 36D to generate the outputs $C_{1A}$ through $C_{1D}$ in accordance with the input f, and the sensor unit 44 to generate the output $C_2$ in accordance with the input f, while the dome switch 64 generates the output Cd when the protrusion 30 is pressed down. The output $C_2$ of the sensor unit 44 reaches a saturated state soon after the displacement part 24 starts to displace as mentioned before.

With such a constitution, it is possible, similar to the aforementioned force sensor 20 (FIG. 19) according to the eight embodiment, to obtain the output $C_{1A}$ through $C_{1D}$ from the sensor unit 36A through 36D according to the displacement of the displacement part 24 and the output $C_2$ from the sensor unit 44 corresponding with the input f. Also, it is possible to obtain the outputs $C_{OA}$ through $C_{OD}$ void of any residual output by extracting the aforementioned time information from the output $C_2$ constituting a detection system (e.g., FIG. 20) using the force sensor 20 and the detection program (FIG. 11) and executing compensation processes for the outputs $C_{1A}$ through $C_{1D}$ using said time information (FIG. 12).

Eleventh Embodiment

The eleventh embodiment of the present invention will be described below referring to FIG. 22. FIG. 22 shows the force sensor according to the eleventh embodiment, wherein (A) is its vertical cross section and (B) is its plan view showing the shape and layout of the detection electrodes. Those parts that are identical to those in the sixth embodiment are identified with identical code numbers.

This embodiment relates to a force sensor, in which a force f applied in the direction of the slide and the force f is converted into capacity. In this force sensor 20, a displacement part 24 provide on a substrate 22 is equipped with a flexible support part 26 and an input part 28 integrally formed with the support part 26. The input part 28 has a flexible part 66 in order to facilitate the slide deformation by the input f, and an input pad 68 is formed in the center surrounded by the flexible part 66. The displacement part 24 is made of an elastic material such as rubber or metallic so that it can deform when an external force is applied and restore its original form when the force is removed.

Similar to the aforementioned embodiments, detection electrodes 32A and 32B formed on the substrate 22 and a single electrode 34 constitute sensor units 36A and 36B. Also, a detection electrode 40 is formed in the space between the detection electrodes 32A and 32B, while said detection electrode 40 and the electrode 34 (42) constitute a sensor unit 44.

In the force sensor 20, a force is applied in the direction indicated as fd in the drawing by a finger 70 as shown in FIG. 23(A), the electrode distance "d" of the sensors 36A and 36B become narrower to generate outputs $C_{1A}$ and $C_{1B}$, while the electrode distance "d" of the sensor 44 also becomes narrower to generate an output $C_2$, as well as causing a saturated condition due to the electrode contact. As shown in FIG. 23(B), sliding the input pad 68 in the left (L) direction at this point with the output $C_2$ in saturation, increases the output $C_{1A}$ of the sensor 36A and then to saturate, while the output $C_{1B}$ of the sensor 36B reduces as the electrode distance d increases. When the input pad 68 slides to the right (R) direction, the output $C_2$ remains in saturation, the output $C_{1B}$ of the sensor 36B increases and reaches a saturation state, while the output $C_{1A}$ of the sensor 36A reduces as its electrode distance d increases. With reference to such input/output relations, FIG. 24(A) shows the outputs $C_{1A}$ and $C_{1B}$ of the sensors 36A and 36B respectively, while and FIG. 24(B) shows the output $C_2$ of the sensor 44.

Constituting a force detection system 46 (FIG. 18) using such a force sensor 20 makes it possible to compensate the outputs $C_{1A}$ and $C_{1B}$ using the aforementioned time information and level information extracted from the output $C_2$ as the reference information of the outputs $C_{1A}$ and $C_{1B}$ to obtain the outputs $C_{0A}$ and $C_{0B}$ void of residual outputs.

Figure 25:
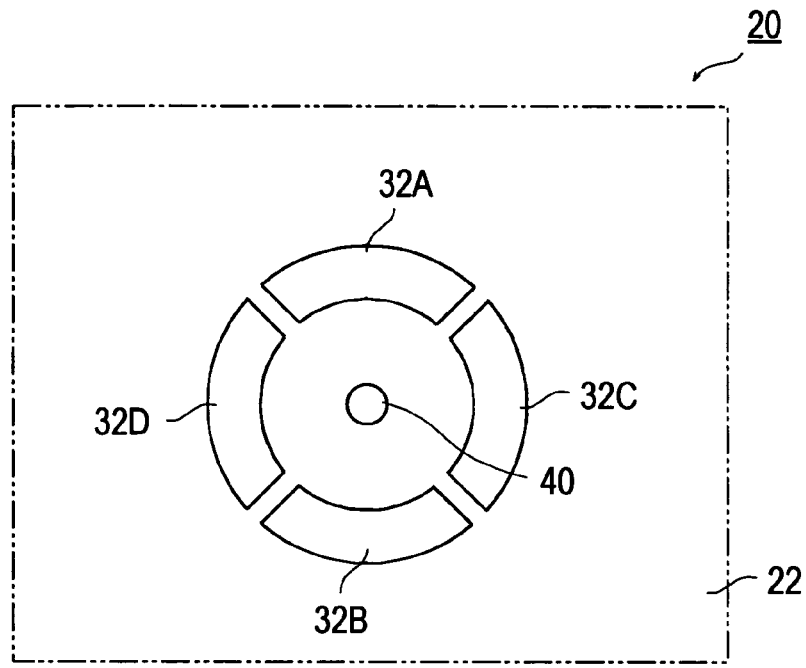
FIG. 25 is a plan view showing a variation of the detection electrode.

Next, variations and other features of those embodiments mentioned above will be described in the following:

(1) Although the left and right sliding mechanism was described in the eleventh embodiment, it is also possible to constitute the system as shown in FIG. 25, wherein a circular detection electrode 40 is accompanied with arc-shaped detection electrodes 32A, 32B, 32C and 32D arranged on a concentric circle to surround it and allow an electrode 42 to slide in order to detect the slide displacement in two dimensions (X and Y directions).

Figure 26:
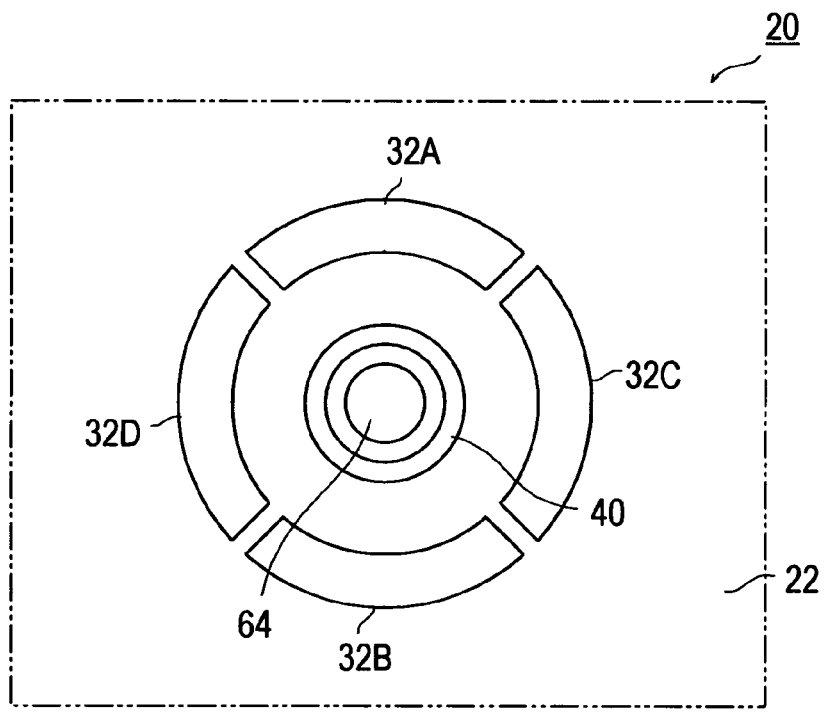
FIG. 26 is a plan view showing a variation of the detection electrode.

(2) Also, the system can be constituted, as shown in FIG. 26, of an annular detection electrode 40 and a dome switch 64 (FIG. 21) located in the center to obtain the output from a detection electrode 40 as the reference information as well as the output of the dome switch 64 corresponding to the vertical deformation of a displacement unit 24. Obtaining multiple outputs from the single displacement unit 24 makes it possible to use the force sensor 20 for multiple purposes.

(3) When in a process shown in FIG. 12 a threshold value is assigned for the output $C_2$ from the sensor unit 44 to use it as the zero point information in order to make the output $C_1$ from the sensor unit 36 zero, this zero information is stored in a storage means for the above process, so that it is possible to stabilize the zero output despite any changes in the value due to the relaxation of the residual stress, and to achieve the force detection system 46 which provides an extremely high repeatability even for a minute input, and cause almost no time delay td (FIG. 12) between input and output. In other words, it is possible to build an excellent sensor system with a highly stable zero point, high output repeatability for minute inputs, and no time delay.

(4) In the aforementioned embodiments (FIG. 6, FIG. 14, FIG. 16, and FIG. 19), the protrusion 30 can be used to have a small additional protrusion 72 as shown in FIG. 27(A) at the tip of the protrusion 30 to carry an electrode 42, or to form a foot or skirt 74 at the tip of the protrusion 30 to carry an electrode 42 as shown in FIG. 27(B), or to have a plurality of small protrusions 76 at the tip of the protrusion 30 to be used as electrodes 42 as shown in FIG. 27(C). Constituted as such, it is possible to improve the input/output response of the sensor unit 44 in order to obtain improved reference information such as zero point information with higher accuracy.

(5) The force sensors according to the present invention can maintain high reliability in the input/output relation thanks to the improved stability of their zero point outputs even when the energization between electrodes is canceled for power saving.

The present invention relates to a force censor, a force detection system and a force detection program that convert a mechanical input to capacitance, and it is capable of obtaining a plurality of outputs from a common input in order to eliminate residual outputs and to improve output accuracy, for example, by means of using time information extracted from one output as reference information for another output, thus to be used as an effective conversion means for converting various types of mechanical input into electrical signals.

What is claimed is:

1. A force sensor comprising:
   a displacement unit that displaces when a force is applied;
   at least one first sensor unit that generates a first output by detecting the displacement of said displacement unit as change of capacitance; and
   a second sensor unit that is annexed to said first sensor unit and generates a second output which is independent of said first output and rises steeply from said first output and shifts to a saturated state ahead of said first output by detecting the displacement of said displacement unit of the same direction that said first sensor unit detects as change of capacitance.

2. The force sensor of claim 1, wherein the displacement of said displacement unit includes either a deformation of said displacement unit or a movement of said displacement unit by force or both thereof.

3. The force sensor of claim 1, wherein said second sensor unit comprises a pair of second detection electrodes provided in the center of said displacement unit, while said first sensor unit comprises a single or a plurality of pair of first detection electrodes that surround said second detection electrode separated by an insulation distance.

4. A force detection system comprising:
   a force sensor equipped with a displacement unit that displaces when a force is applied, at least one first sensor unit that generates a first output by detecting the displacement of said displacement unit as change of capacitance; and a second sensor unit that is annexed to said first sensor unit and generates a second output which is independent of said first output and rises steeply from said first output and shifts to a saturated state ahead of said first output by detecting the displacement of said displacement unit of the same direction that said first sensor unit detects as change of capacitance; and
   a processing unit that obtains said first output using said second output of said force sensor as a reference information for said first output.

5. The force detection system of claim 4, further comprising, a time information extracting unit for extracting time information representing level periods that exceed a specified level from said second output, wherein said processing unit obtains said first output referencing said time information extracted by said time information extracting unit.

6. A force detection system comprising:
   a force sensor equipped with first and second sensor units in a displacement unit that displaces when a force is applied and generates first and second outputs that are independent to each other and represent the displacement of said displace unit; and
   a processing unit that obtains said first output using said second output of said force sensor as a reference information for said first output, wherein said second sensor unit of said force sensor shifts said second output to a saturated condition after said displacement unit starts to displace.

7. The force detection system of claim 4 wherein said reference information is zero point information of said first output.

8. A method for detecting a force comprises the following steps:
   obtaining a first output from a first sensor unit provided in a displacement unit that displaces in response to the application of the force;
   obtaining a second output which is independent of said first output and rises steeply from said first output and shifts to a saturated state ahead of said first output as change of capacitance from a second sensor unit provided in said displacement unit and detecting the displacement of said displacement unit of the same direction that said first sensor unit detects as change of capacitance;

extracting time information representing a level period that exceeds a specified level from said second output; and obtaining said first output referencing said time information.

* * * * *